US009666754B2

(12) United States Patent
Park et al.

(10) Patent No.: US 9,666,754 B2
(45) Date of Patent: May 30, 2017

(54) METHOD OF MANUFACTURING SEMICONDUCTOR SUBSTRATE AND SUBSTRATE FOR SEMICONDUCTOR GROWTH

(71) Applicant: SAMSUNG ELECTRONICS CO., LTD., Suwon-si (KR)

(72) Inventors: Young Hwan Park, Yongin-si (KR); Sam Mook Kang, Hwaseong-si (KR); Jun Youn Kim, Hwaseong-si (KR); Mi Hyun Kim, Seoul (KR); Joo Sung Kim, Seongnam-si (KR); Young Jo Tak, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/130,379

(22) Filed: Apr. 15, 2016

(65) Prior Publication Data
US 2016/0351748 A1 Dec. 1, 2016

(30) Foreign Application Priority Data

May 27, 2015 (KR) .................. 10-2015-0073727
Dec. 1, 2015 (KR) .................. 10-2015-0169791

(51) Int. Cl.
*H01L 21/30* (2006.01)
*H01L 21/46* (2006.01)
(Continued)

(52) U.S. Cl.
CPC ............ *H01L 33/007* (2013.01); *H01L 33/12* (2013.01)

(58) Field of Classification Search
CPC ............... H01L 33/0079; H01L 33/007; H01L 27/1266; H01L 33/12
(Continued)

(56) References Cited

U.S. PATENT DOCUMENTS 6,071,795 A 6/2000 Cheung et al.
6,372,608 B1 4/2002 Shimoda et al.
(Continued)

FOREIGN PATENT DOCUMENTS

JP 2015-40136 A 3/2015
KR 10-2005-0029735 A 3/2005
(Continued)

*Primary Examiner* — Thien F Tran
(74) *Attorney, Agent, or Firm* — Sughrue Mion, PLLC

(57) ABSTRACT

A method of manufacturing a semiconductor substrate may include: forming a buffer layer on a growth substrate; forming a plurality of openings in the buffer layer, the plurality of openings penetrating through the buffer layer and being spaced apart from one another; forming a plurality of cavities on the growth substrate, the plurality of cavities being aligned to respectively correspond to the plurality of openings; growing a semiconductor layer on the buffer layer, the growing the semiconductor layer including filling the plurality of openings with the semiconductor layer; and separating the buffer layer and the semiconductor layer from the growth substrate, wherein a diameter of each of the plurality of openings at a boundary between the growth substrate and the buffer layer is smaller than a diameter of each of the plurality of cavities at the boundary.

20 Claims, 19 Drawing Sheets

(51) Int. Cl.
*H01L 33/00* (2010.01)
*H01L 33/12* (2010.01)

(58) Field of Classification Search
USPC ............... 438/458, 478, 422, 977, 464, 759
See application file for complete search history.

(56) References Cited

U.S. PATENT DOCUMENTS

| | | | |
|---|---|---|---|
| 6,468,347 B1 | 10/2002 | Motoki et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,196,399 B2 | 3/2007 | Usui et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,790,489 B2 | 9/2010 | Shibata | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,207,054 B2 | 6/2012 | Shibata | |
| 8,247,310 B2 | 8/2012 | Tsang | |
| 8,263,987 B2 | 9/2012 | Choi et al. | |
| 8,324,646 B2 | 12/2012 | Lee et al. | |
| 8,334,156 B2 | 12/2012 | Kim et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2002/0197825 A1 | 12/2002 | Usui et al. | |
| 2006/0148186 A1 | 7/2006 | Lee et al. | |
| 2010/0261300 A1* | 10/2010 | Tu | H01L 33/0079 438/29 |
| 2012/0142142 A1* | 6/2012 | Chang | H01L 21/0242 438/104 |
| 2017/0047479 A1* | 2/2017 | Hertkorn | H01L 33/12 |

FOREIGN PATENT DOCUMENTS

| | | |
|---|---|---|
| KR | 10-0809211 B1 | 2/2008 |
| KR | 10-1005765 B1 | 1/2011 |
| KR | 10-2014-0148200 A | 12/2014 |
| WO | 2007/133044 A1 | 11/2007 |

* cited by examiner

METHOD OF MANUFACTURING SEMICONDUCTOR SUBSTRATE AND SUBSTRATE FOR SEMICONDUCTOR GROWTH

CROSS-REFERENCE TO RELATED APPLICATIONS

This application claims priority from Korean Patent Application No. 10-2015-0073727 filed on May 27, 2015 and Korean Patent Application No. 10-2015-0169791 filed on Dec. 1, 2015, with the Korean Intellectual Property Office, the disclosures of which are incorporated herein by reference in their entireties.

BACKGROUND

Methods and apparatuses consistent with example embodiments relate to a method of manufacturing a semiconductor substrate and relate to a substrate for semiconductor growth.

Semiconductor light emitting devices are widely seen as next generation lighting sources having many advantages such as relatively long lifespans, low degrees of power consumption, rapid response speeds, and environmental friendliness and have come to prominence as an important type of light source for use in various products such as in general lighting devices and in the backlights of display devices. In particular, nitride-based light emitting devices based on Group III nitrides, such as gallium nitride (GaN), aluminum gallium nitride (AlGaN), indium gallium nitride (InGaN), and indium aluminum gallium nitride (InAlGaN), play an important role as semiconductor light emitting devices outputting blue or ultraviolet light.

As a substrate used for manufacturing a semiconductor light emitting device, a sapphire substrate, a silicon (Si) substrate, or a gallium nitride (GaN) substrate is used. In particular, when a nitride-based light emitting device is manufactured using the GaN substrate, defects within a light emitting device may be considerably reduced. Here, a technique for manufacturing a large GaN substrate through a simplified process without increasing manufacturing costs is required.

SUMMARY

One or more example embodiments provide a method of manufacturing a semiconductor substrate facilitating a manufacturing process, and a substrate for semiconductor growth.

According to an aspect of an example embodiment, a method of manufacturing a semiconductor substrate may include forming a buffer layer on a growth substrate, forming a plurality of openings in the buffer layer such that the plurality of openings penetrate through the buffer layer and are disposed to be spaced apart from one another, forming a plurality of cavities in the growth substrate such that the plurality of cavities are disposed below the plurality of openings, growing a semiconductor layer on the buffer layer, filling the plurality of openings, and extending upwardly from the buffer layer, and separating the buffer layer and the semiconductor layer from the growth substrate through stress applied to the plurality of cavities, wherein a diameter of each of the plurality of openings is smaller than a diameter of each of the plurality of cavities in the boundary between the growth substrate and the buffer layer.

The buffer layer may protrude, relative to the growth substrate, to form an undercut region within each of the plurality of cavities.

The plurality of cavities may be covered by the semiconductor layer to form closed regions between the semiconductor layer and the growth substrate.

In the separating, a crack may be generated along the boundary between the buffer layer and the growth substrate from the plurality of cavities in a transverse direction.

The plurality of openings may be formed by a dry etching method, and the plurality of cavities may be formed by a wet etching method.

The plurality of openings and the plurality of cavities may be formed in a single process.

The plurality of cavities may be defined by surfaces in accordance with crystal planes of the growth substrate.

Each of the plurality of cavities may be defined by seven or more surfaces.

One surface of the growth substrate connected to the buffer layer within each of the plurality of cavities may be a negative sloped surface.

The plurality of cavities may be disposed only in a portion of the growth substrate.

In the separating, the semiconductor layer may start to be separated from the portion of the growth substrate in which the plurality of cavities are formed.

A thickness of the semiconductor layer grown on the growth substrate, before being separated from the growth substrate, may be controlled by adjusting a size and density of the plurality of openings.

An area of the plurality of openings may range from 20% to 90% of an area of the buffer layer.

A ratio of a diameter of the plurality of openings to a space between the plurality of openings may range from 0.65 to 18.

The growth substrate and the buffer layer may have different coefficients of thermal expansion.

The growth substrate may be a silicon (Si) substrate, and the buffer layer and the semiconductor layer may be formed of a gallium nitride.

The method may further include forming a growth suppressing layer on a surface of the growth substrate exposed through the plurality of cavities.

The forming of the growth suppressing layer may include treating the growth substrate with ammonia.

According to an aspect of another example embodiment, a method of manufacturing a semiconductor layer may include forming a buffer layer on a growth substrate, forming a plurality of openings in the buffer layer such that the plurality of openings penetrate through the buffer layer and are disposed to be spaced apart from one another, forming a plurality of cavities in the growth substrate such that the plurality of cavities are disposed below the plurality of openings, growing a semiconductor layer on the buffer layer, filling the plurality of openings, and extending upwardly from the buffer layer, and separating the buffer layer and the semiconductor layer from the growth substrate through stress applied to the plurality of cavities.

The buffer layer may protrude, relative to the growth substrate, to form an undercut region within each of the plurality of cavities.

The growth substrate may be a silicon wafer, and the buffer layer and the semiconductor layer may be single crystalline Group III nitride.

According to an aspect of another example embodiment, a method of manufacturing a semiconductor layer may include preparing a stacked structure of a growth substrate and a buffer layer, forming a plurality of openings extending to an interior of the growth substrate by penetrating through the buffer layer, and disposed to be spaced apart from one another, growing a semiconductor layer from the buffer layer such that a plurality of cavities are formed within the growth substrate, and separating the buffer layer and the semiconductor layer from the growth substrate through stress applied to the plurality of cavities.

According to another aspect of the present inventive concept, a substrate for semiconductor growth may include a growth substrate having a plurality of cavities disposed to be spaced apart from one another on one surface thereof, and a buffer layer disposed on the growth substrate and having a plurality of openings disposed to correspond to the plurality of cavities, wherein a diameter of each of the plurality of openings is smaller than a diameter of each of the plurality of cavities in the boundary between the growth substrate and the buffer layer.

The plurality of cavities may only be disposed in a portion of the growth substrate.

The growth substrate may be a silicon wafer, and a material of the buffer layer may be single crystalline Group III nitride.

According to an aspect of another example embodiment, a method of manufacturing a semiconductor substrate may include: forming a buffer layer on a growth substrate; forming a plurality of openings in the buffer layer, the plurality of openings penetrating through the buffer layer and being spaced apart from one another; forming a plurality of cavities on the growth substrate, the plurality of cavities being aligned to respectively correspond to the plurality of openings; growing a semiconductor layer on the buffer layer, the growing the semiconductor layer including filling the plurality of openings with the semiconductor layer; and separating the buffer layer and the semiconductor layer from the growth substrate, wherein a diameter of each of the plurality of openings at a boundary between the growth substrate and the buffer layer is smaller than a diameter of each of the plurality of cavities at the boundary.

The buffer layer may protrude in the plurality of cavities in plan view to form an undercut region within each of the plurality of cavities.

The growing the semiconductor layer may include covering the plurality of cavities with the semiconductor layer to form closed regions between the semiconductor layer and the growth substrate.

The separating may include generating a crack from the plurality of cavities in a transverse direction along the boundary between the buffer layer and the growth substrate.

The forming the plurality of openings may include forming the plurality of openings by a dry etching method, and the forming the plurality of cavities may include forming the plurality of cavities by a wet etching method.

The forming the plurality of openings and the forming the plurality of cavities may include forming the plurality of openings and the plurality of cavities in a single process.

The forming the plurality of cavities may include defining surfaces of each of the plurality of cavities in accordance with crystal planes of the growth substrate.

Each of the plurality of cavities may include at least seven surfaces.

At least one surface of each of the plurality of cavities may include a negative slope such that a cross-sectional area of the growth substrate decreases in a direction away from the buffer layer.

The forming the plurality of cavities may include forming the plurality of cavities only in one of an inner portion or an outer portion of the growth substrate.

In the separating, the semiconductor layer may start to be separated from the growth substrate at the one of the inner portion or the outer portion in which the plurality of cavities are formed.

The separating may include controlling a thickness of the semiconductor layer grown on the growth substrate, before being separated from the growth substrate, by adjusting a size and density of the plurality of openings.

A total area of the plurality of openings may range from 20% to 90% of a total area of the buffer layer.

A ratio of a diameter of each of the plurality of openings to a distance between adjacent openings of the plurality of openings may range from 0.65 to 18.

The method may further include forming a growth suppressing layer on a surface of the growth substrate exposed through the plurality of cavities.

The forming the growth suppressing layer may include treating the growth substrate with ammonia.

According to an aspect of another example embodiment, a method of manufacturing a semiconductor layer may include: forming a buffer layer on a growth substrate; forming a plurality of openings in the buffer layer, the plurality of openings penetrating through the buffer layer and being spaced apart from one another; forming a plurality of cavities in the growth substrate, the plurality of cavities are disposed below the plurality of openings; growing a semiconductor layer on the buffer layer, the growing including filling the plurality of openings with the semiconductor layer; and separating the buffer layer and the semiconductor layer from the growth substrate through stress generated at the plurality of cavities.

The buffer layer may overhang over the plurality of cavities of the growth substrate to form an undercut region within each of the plurality of cavities.

The growth substrate may include a silicon wafer, and the buffer layer and the semiconductor layer may include single crystalline Group III nitride.

According to an aspect of another example embodiment, a method of manufacturing a semiconductor layer may include: preparing a stacked structure of a growth substrate and a buffer layer; forming a plurality of openings extending to an interior of the growth substrate by penetrating through the buffer layer, the plurality of openings being spaced apart from one another; growing a semiconductor layer from the buffer layer thereby forming a plurality of cavities within the growth substrate; and separating the buffer layer and the semiconductor layer from the growth substrate through stress generated at the plurality of cavities.

According to an aspect of another example embodiment, a method of manufacturing a semiconductor substrate may include: providing a buffer layer on a growth substrate; forming at least one opening and at least one cavity in the buffer layer and in the growth substrate, respectively; growing a semiconductor layer from the buffer layer including the opening; and separating the buffer layer and the semiconductor layer from the growth substrate using a difference in coefficients of thermal expansion between the growth substrate and the buffer layer at the at least one cavity.

The forming the at least one opening and the at least one cavity may include forming an undercut region within the at least one cavity, the undercut region being generated due to a difference between a width of the at least one opening and a width of the at least one cavity.

The buffer layer may overhang over the at least one cavity of the growth substrate to form the undercut region within the at least one cavity.

A maximum length of the at least one opening measured along a junction surface between the growth substrate and the buffer layer may be smaller than a maximum length of the at least one cavity measured along the junction surface, the junction surface corresponding to a surface where the growth substrate and the buffer layer are joined.

An area of the opening on the junction surface may range from 20% to 90% of an area of the buffer layer on the junction surface.

The at least one opening and the at least one cavity may be concentric.

The at least one cavity may include a plurality of cavities, and the forming the at least one cavity may include forming the plurality of cavities only in one of an inner portion or an outer portion of the growth substrate.

According to an aspect of another example embodiment, a method of manufacturing a semiconductor substrate may include: providing a buffer layer on a growth substrate; forming at least one opening and at least one cavity in the buffer layer and in the growth substrate, respectively, the at least one opening and the at least one cavity being concentric to each other; growing a semiconductor layer from the buffer layer including the at least one opening; and separating the buffer layer and the semiconductor layer from the growth substrate, wherein the buffer layer may overhang over the at least one cavity of the growth substrate to form an undercut region within the at least one cavity.

The separating may include separating using a difference in coefficients of thermal expansion between the growth substrate and the buffer layer at the at least one cavity.

The at least one cavity may include a plurality of cavities, and the forming the at least one cavity may include forming the plurality of cavities only in one of an inner portion or an outer portion of the growth substrate.

BRIEF DESCRIPTION OF DRAWINGS

The above and/or other aspects, features and advantages of the disclosure will be more clearly understood from the following detailed description taken in conjunction with the accompanying drawings, in which.

DETAILED DESCRIPTION

Figure 1:
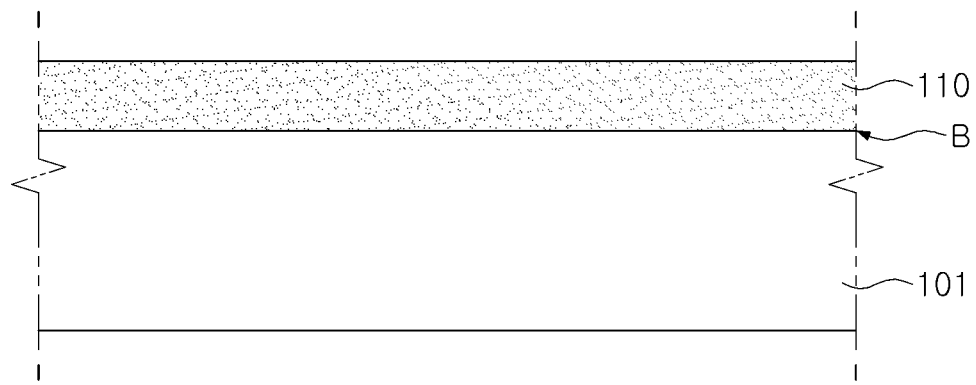
FIGS. 1 through 6 are cross-sectional views schematically illustrating major stages in a method of manufacturing a semiconductor substrate/layer according to an example embodiment.

Hereinafter, example embodiments of the inventive concept will be described in detail with reference to the accompanying drawings.

The inventive concept may, however, be exemplified in many different forms and should not be construed as being limited to the specific embodiments set forth herein. Rather, the example embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

The terminology used herein is used for the purpose of describing particular example embodiments only and is not intended to be limiting of the inventive concept. Also, as used herein, singular forms "a", "an" and "the" are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added. Terms "and/or" include any one or all of one or more combinations of corresponding enumerated items.

Also, though terms like a first and a second are used to describe various members, components, regions, layers, and/or portions in various example embodiments of the inventive concept, the members, components, regions, layers, and/or portions are not limited to these terms. These terms are used only to differentiate one member, component, region, layer, or portion from others thereof. Therefore, a member, a component, a region, a layer, or a portion referred to as a first member, a first component, a first region, a first layer, or a first portion in an embodiment may be referred to as a second member, a second component, a second region, a second layer, or a second portion in another example embodiment.

In the descriptions of the example embodiments, Miller indices expressing a set of three integers as a notation describing crystallographic planes or directions are used. A plurality of planes and directions relatively symmetrical to each other with respect to a crystal axis are crystallographically equivalent, and certain planes and directions having a given Miller index may be shifted within a lattice only according to a scheme of selecting a position and orientation of a unit cell. The equivalent planes and directions may be expressed as a family, and descriptions of any one plane belonging to one family, for example, a crystal plane {100}, may also be applied to three equivalent planes (100), (010), and (001) in the same manner unless otherwise mentioned.

FIGS. 1 through 6 are cross-sectional views schematically illustrating major stages in a method of manufacturing a semiconductor substrate or layer according to an example embodiment.

Figure 7:
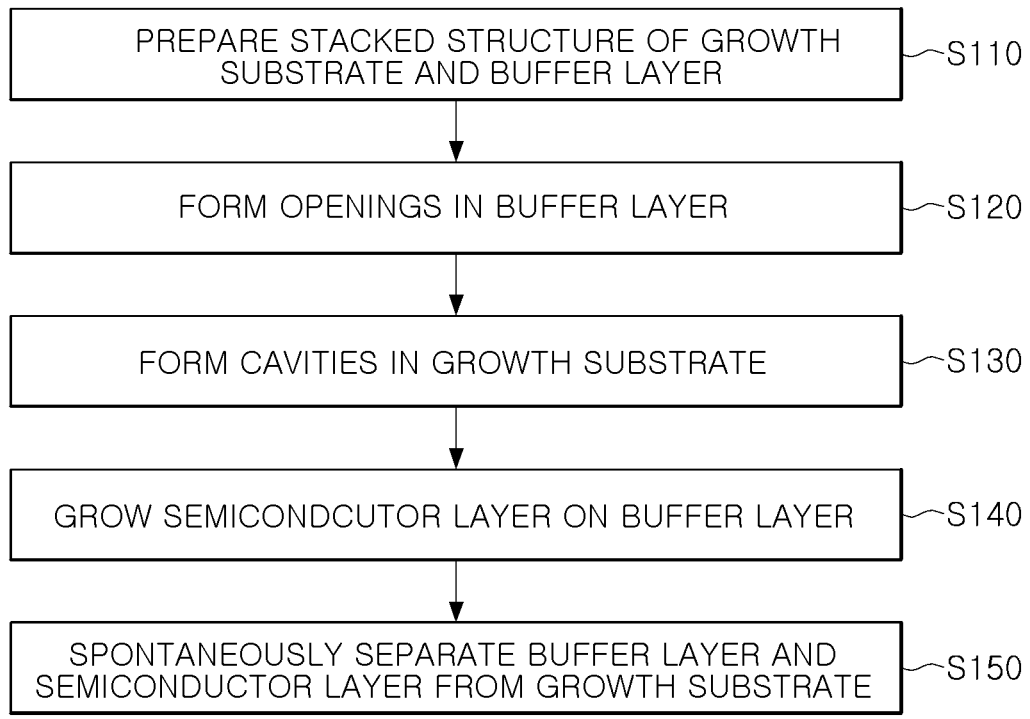
FIG. 7 is a flow chart schematically illustrating a method of manufacturing a semiconductor substrate/layer according to an example embodiment.

FIG. 7 is a flow chart schematically illustrating a method of manufacturing a semiconductor substrate or layer according to an example embodiment.

Referring to FIGS. 1 and 7, a buffer layer 110 may be formed on a growth substrate 101 to provide a stacked structure of the growth substrate 101 and the buffer layer 110 in operation S110.

The growth substrate 101, which is a substrate for semiconductor growth, may be a heterogeneous substrate with respect to a gallium nitride (GaN) as a semiconductor layer to be grown. The growth substrate 101 may be formed of an insulating, a conductive, or a semiconductive material such as silicon, sapphire, SiC, $MgAl_2O_4$, MgO, $LiAlO_2$, or $LiGaO_2$. When the silicon is used as a material of the growth substrate 101, for example, a single crystalline silicon (Si) wafer of six (6) inches or greater may be used, and in this case, it may be appropriate for increasing a diameter and is relatively low in price, facilitating mass-production. For growth of a nitride-based compound, for example, a (111) plane of the silicon substrate may be used. In an example embodiment, the growth substrate 101 may include an impurity in at least a portion thereof.

The buffer layer 110 is a layer serving to enhance crystallinity of semiconductor layers to be grown, which may include a monolayer or a plurality of layers. The buffer layer 110 may have a coefficient of thermal expansion different from that of the growth substrate 101, and thus, the buffer layer 110 may include a material having a coefficient of thermal expansion different from that of the growth substrate 101. When the growth substrate 101 is a silicon (Si) substrate, a coefficient of thermal expansion of the silicon substrate may be about $2.6 \times 10^{-6}$/K ((111) plane) or about $3.7 \times 10^{-6}$/K ((100) plane) according to a crystal direction of an upper surface thereof. When the growth substrate 101 is a SiC substrate, a coefficient of thermal expansion of the silicon substrate may be about $4.2 \sim 4.7 \times 10^{-6}$/K. Thus, when the buffer layer 110 is formed of GaN, a coefficient of thermal expansion thereof is about $5.59 \times 10^{-6}$/K, making a difference from that of the growth substrate 101.

A material of the buffer layer 110 may be a Group III nitride and may include, for example, a material of $Al_xIn_yGa_{1-x-y}N$, where $0 \leq x \leq 1$, $0 \leq y < 1$, and $0 \leq x+y \leq 1$. In a case in which the buffer layer 110 is formed of a plurality of layers, the plurality of layers may be formed as a multi-layer structure including monolayers of AlN, SiC, $Al_2O_3$, AlGaN, AlInGaN, AlInBGaN, AlBGaN, GaN, XY or combinations thereof. Here, X may be titanium (Ti), chromium (Cr), zirconium (Zr), hafnium (Hf), niobium (Nb) or tantalum (Ta), and Y may be nitrogen (N) or boron (B or $B_2$). In an example embodiment, a layer in direct contact with the growth substrate 101 in the buffer layer 110 may be formed of AlN to form a nucleus for epitaxial growth of a semiconductor layer and prevent a melt-back phenomenon in which silicon (Si) of the growth substrate 101 and gallium of the single crystalline nitride in the buffer layer 110 react to form a eutectic metal.

The buffer layer 110 may be formed on the growth substrate 101 through a metal organic chemical vapor deposition (MOCVD) process or a hydride vapor phase epitaxy (HVPE) process.

Figure 2:
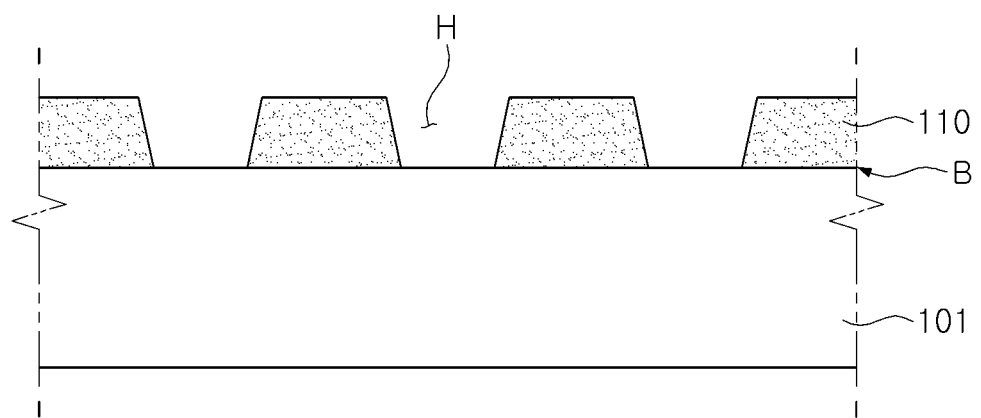

Referring to FIGS. 2 and 7, a plurality of openings H may be formed in the buffer layer 110.

The plurality of openings H may be formed to be spaced apart from one another in the buffer layer 110. The openings H may have various shapes such as a circular shape, an oval shape, a quadrangular shape, or a polygonal shape, on the plane.

The openings H may be formed through an etching method such as dry etching. As illustrated, side walls of the buffer layer 110 forming the openings H may be sloped with respect to an upper surface of the growth substrate 101, but the configuration of the side walls is not limited thereto.

Figure 3:
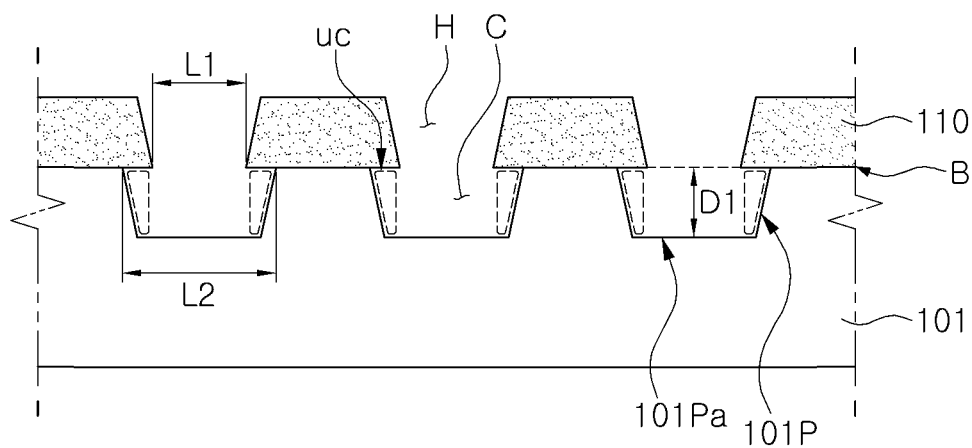

Referring to FIGS. 3 and 7, a plurality of cavities C may be formed on the growth substrate 101 in operation 5130.

The plurality of cavities C may be formed below the plurality of openings H so as to be connected to the plurality of openings H. The cavities C may be formed by removing portions of the growth substrate 101 by a predetermined depth D1. The cavities C may be formed through an etching method such as dry etching or wet etching. In an example embodiment, operation 5130 may be performed together with operation 5120 as a single process or as a single operation. In an example embodiment, operation 5120 of forming the openings H may include dry etching, and operation 5130 may include wet etching.

The cavities C may be defined by etched surfaces 101Pa and 101Pb of the growth substrate 101. Among the surfaces 101Pa and 101Pb, the surface 101Pb is a side surface which may be sloped with respect to the upper surface of the growth substrate, and the surface 101Pa is a bottom surface which may be parallel to the upper surface of the growth substrate. A shape of the cavities C may be modified according to example embodiments. At least portions of the surfaces 101Pa and 101Pb may correspond to a crystal plane of the growth substrate 101, but the example embodiment is not limited thereto.

At a boundary B between the buffer layer 110 and the growth substrate 101, each of the plurality of openings H may have a diameter of a first length L1, and each of the plurality of cavities C may have a diameter of a second length L2 greater than the first length L1. In a case in which the openings H and the cavities C do not have a circular shape, the "diameter" may refer to dimensions having a greatest length on a plane. For example, in a case in which the openings H and the cavities C have a quadrangular shape, the "diameter" may refer to a length of a diagonal line in the quadrangular cavities. Because the dimension of the cavities C is greater than that of the openings H, the buffer layer 110 protrudes relative to the substrate 101 within the openings H and the cavities C, forming an undercut region UC within the cavities C. In other words, the buffer layer 110 may protrude in the plurality of cavities C in plan view of the buffer layer 110 and the growth substrate 101 to form the undercut region UC within each of the plurality of cavities C. The undercut region UC may correspond to a lower portion of the protruded portion of the buffer layer 110 with respect to the cavities C. A length of an upper portion of the undercut region UC on one side may range from 10% to 30% of the second length L2, for example.

Figure 4:
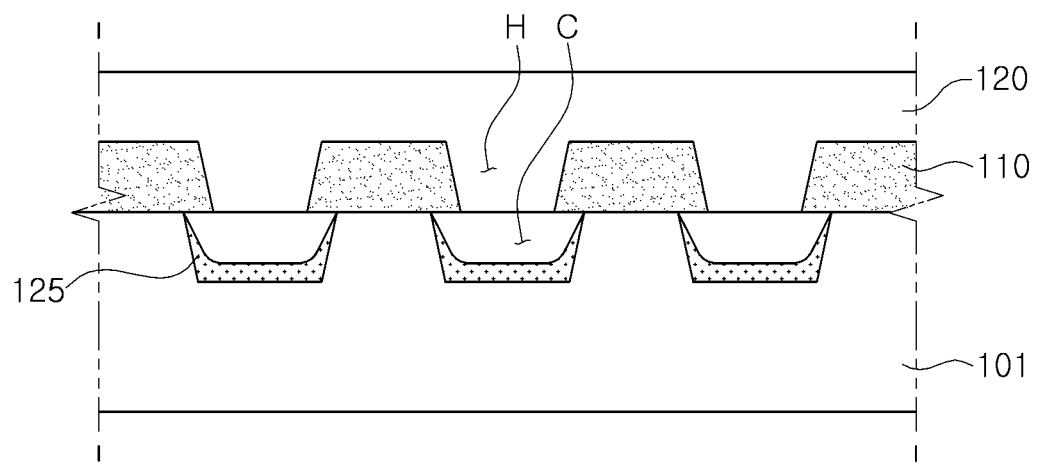

Referring to FIGS. 4 and 7, a semiconductor layer 120 may be grown on the buffer layer 110 in operation S140.

The semiconductor layer 120 may be epitaxially grown on the buffer layer 110. The semiconductor layer 120 may be a single crystalline and may have a composition of $Al_xIn_yGa_{1-x-y}N$, where $0 \leq x < 1$, $0 \leq y \leq 1$, and $0 \leq x+y \leq 1$. The semiconductor layer 120 may be grown from the buffer layer 110 to fill the openings H. Here, due to geometrical characteristics, the semiconductor layer 120 may be prevented from growing or may not be grown within the cavities C of the growth substrate 101. Like a cavity semiconductor layer 125 illustrated in FIG. 4, a semiconductor layer may be partially grown on the growth substrate 101, maintaining the cavity C as mostly an empty space.

As the openings H are filled with the semiconductor layer 120 grown upwardly from the buffer layer 110, the upper surfaces of respective cavities C may be covered by the semiconductor layer 120 and may form a closed region between the semiconductor layer 120 and the growth substrate 101.

The semiconductor layer 120 may be grown using an HVPE method, and in this case of using the HVPE method, a growth rate of GaN may be very high and a semiconductor layer 120 having a large thickness and a large size may be grown, in comparison with the MOCVD method.

Figure 5:
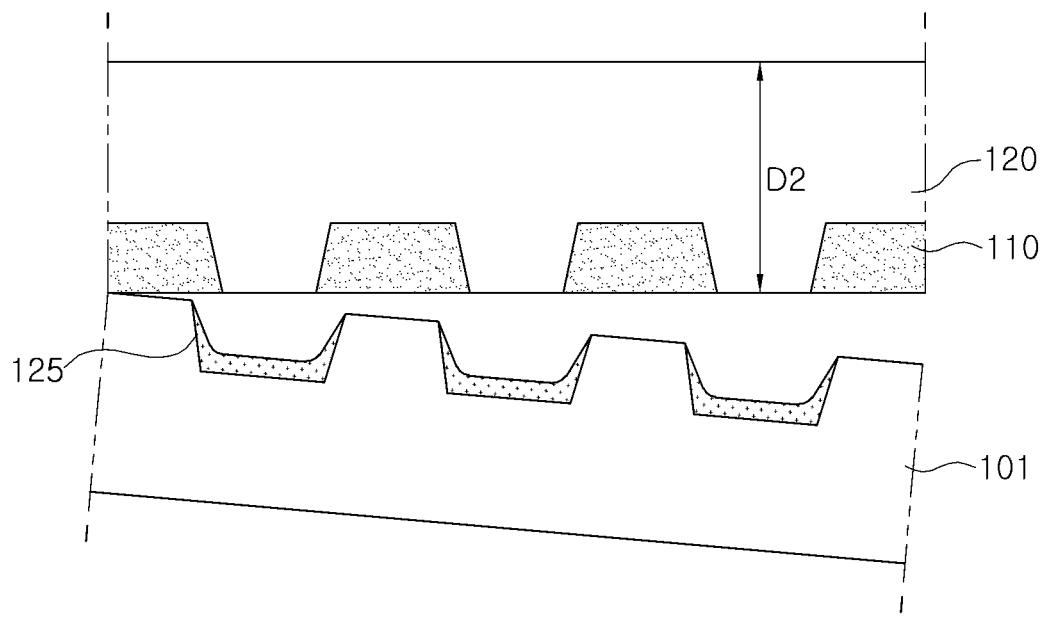

Referring to FIGS. 5 and 7, the buffer layer 110 and the semiconductor layer 120 may be spontaneously separated from the growth substrate 101 in operation S150.

When the semiconductor layer 120 is grown to have an intended thickness D2, stress may concentrate on the cavities C due to a difference in coefficients of thermal expansion and a difference in lattice constants between the growth substrate 101 and the buffer layer 110. Thus, a crack is generated in a transverse direction from the cavities C along the boundary B between the growth substrate 101 and the buffer layer 110, thereby separating the buffer layer 110 and the semiconductor layer 120 from the growth substrate 101. That is, the growth substrate 101 may be separated from the stacked structure of the buffer layer 110 and the semiconductor layer 120.

The above-described separation may be induced by the cavities C. Specifically, the separation may spontaneously occur when the semiconductor layer 120 is grown to have the intended thickness D2 according to a size of each of the cavities C. The thickness D2 of the semiconductor layer 120 causing the separation may range from 10 μm to 5 mm, for example, and such separation may be induced by adjusting the sizes of the cavities C in consideration of an intended thickness of the semiconductor layer 120.

According to the method of manufacturing a semiconductor substrate of the present inventive concept, there is no need to perform a separate process to remove the growth substrate 101, which is a heterogeneous substrate, after the formation of the semiconductor layer 120, and thus, the process may be simplified. Also, because the cavities C are formed uniformly, the separation is also made uniformly, allowing the semiconductor layer 120 may be grown to have a large surface area.

Figure 6:
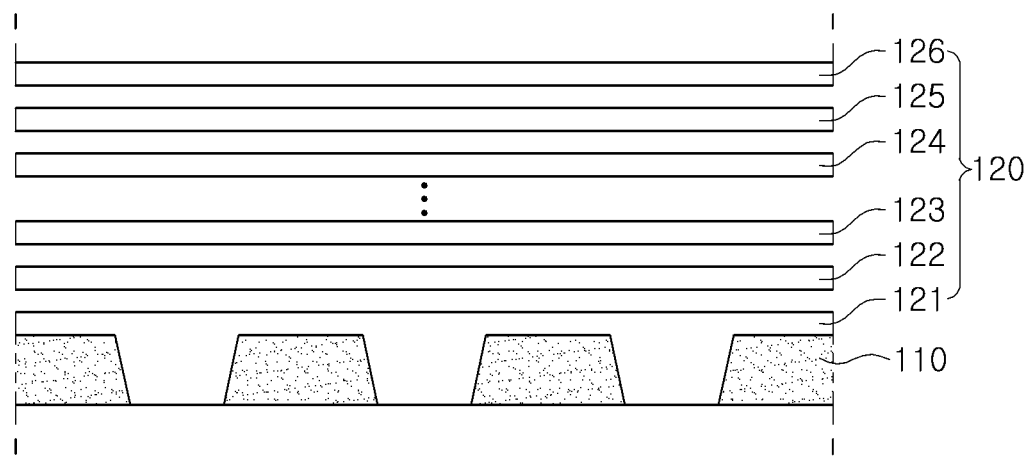

Referring to FIG. 6, the semiconductor layer 120 may be sliced into a plurality of semiconductor substrates 121 to 126.

This slicing operation may be selectively performed, and the plurality of semiconductor substrates 121 to 126 may be manufactured by slicing the semiconductor layer 120 according to various purposes. This slicing operation may be omitted according to an intended thickness of the semiconductor substrate, and in an example embodiment, the slicing operation may be performed to only remove a portion including the buffer layer 110 therebelow.

Each of the semiconductor substrates 121 to 126 is a freestanding substrate and may be used for manufacturing a semiconductor device. For example, each of the semiconductor substrates 121 to 126 may be used to manufacture semiconductor light emitting device by growing GaN semiconductor layers thereon.

Figure 8A:
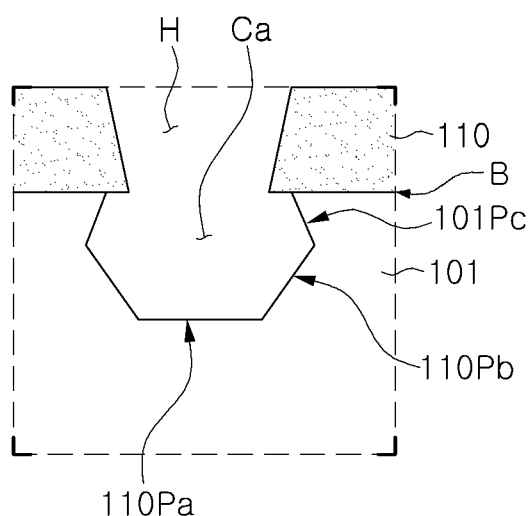
FIGS. 8A to 8C are cross-sectional views schematically illustrating cross-sections of semiconductor substrates for semiconductor growth according to example embodiments.
Figure 8B:
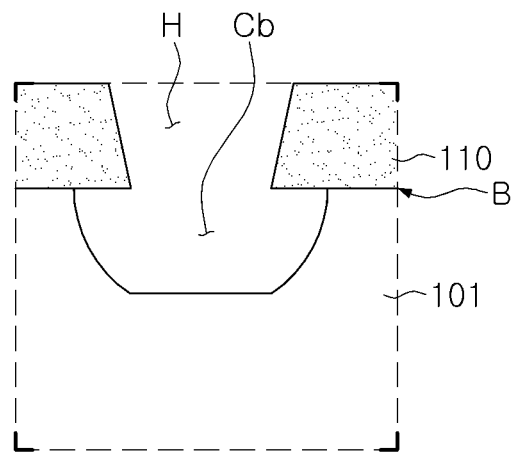
Figure 8C:
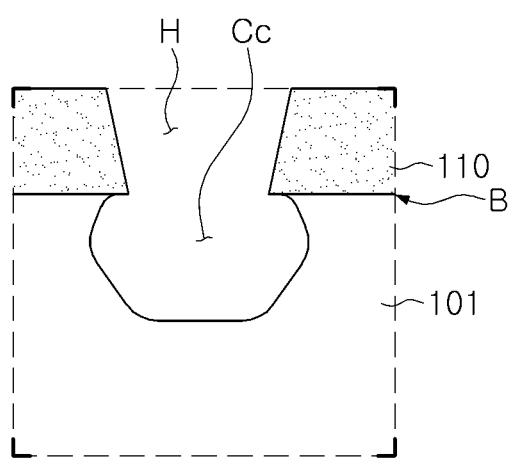

FIGS. 8A to 8C are cross-sectional views schematically illustrating cross-sections of a substrate for semiconductor growth according to example embodiments.

Each of FIGS. 8A through 8C illustrates a region of a substrate for semiconductor growth having a structure in which the growth substrate 101 in which the cavities Ca, Cb and Cc are respectively formed in the growth substrate 101 and the buffer layer 110 in which the openings H are formed are stacked. The substrates of FIGS. 8A through 8C correspond to a semiconductor substrate in a manufacturing stage shown in FIG. 3.

Referring to FIG. 8A, a cavity Ca may be defined by etched surfaces 101Pa, 101Pb, and 101Pc of the growth substrate 101. Among the etched cavity surfaces 101Pa, 101Pb, and 101Pc, the surfaces 101Pb and 101Pc correspond to side surfaces and may be sloped with respect to an upper surface of the growth substrate 101, and the surface 101Pa corresponds to a bottom surface and may be parallel to the upper surface of the growth substrate 101. In the example embodiments, the surfaces 101Pa, 101Pb, and 101Pc may correspond to crystal planes of the growth substrate 101. The surfaces 101Pa, 101Pb, and 101Pc may be formed as etching occurs along the crystal planes when the cavity Ca is formed. The cavity Ca may be defined by five (5) surfaces in the illustrated cross-sections. However, the example embodiment is not limited thereto, and may be defined by seven (7) or more surfaces. In particular, the surface 101Pc corresponding to one of the side surfaces of the growth substrate 101 connected to the buffer layer 110 may be a negative sloped surface. In this disclosure, the "negative slope" is used as a term referring to a slope formed such that a width of the growth substrate 101 is decreased in a direction away from the upper surface. In other words, the "negative slope" is used as a term referring to a slope formed such that a width of the cavities Ca is increased in a direction away from the upper surface of the growth substrate 101. That is, because the surface 101Pc of the growth substrate 101 is sloped such that a width of the growth substrate 101 is decreased in a direction away from the upper surface of the growth substrate 101, it may be referred to as a negative sloped surface.

Referring to FIG. 8B, a cavity Cb may be formed as the growth substrate 101 is etched to have a curved surface. Also, in this case, the buffer layer 110 protrudes, with respect to the growth substrate 101, at the boundary B between the growth substrate 101 and the cavity 110, thereby forming an undercut region within the cavity Cb. In other words, the buffer layer 110 may protrude in the plurality of cavities Cb in plan view of the buffer layer 110 and the growth substrate 101 to form an undercut region within the cavity Cb.

Referring to FIG. 8C, a cavity Cc may be formed along crystal planes of the growth substrate 101 such that boundaries between the planes are alleviated to form a curved surface. Also, in this case, the buffer layer 110 protrudes, with respect to the growth substrate 101, at the boundary B between the growth substrate 101 and the cavity 110, thereby forming an undercut region within the cavity Cc. In other words, the buffer layer 110 may protrude in the cavity Cc in plan view of the buffer layer 110 and the growth substrate 101 to form an undercut region within the cavity Cc.

In the example embodiments, the boundary B refers to a surface where the buffer layer 110 and the growth substrate 101 are joined together (e.g., an interface/a junction surface between the buffer layer 110 and the growth substrate 101).

In this manner, in the growth substrates 101, the cavities Ca, Cb, and Cc may have various shapes within a range in which the buffer layer 110 protrudes to the interior of the cavities Ca, Cb, and Cc.

Figure 9:
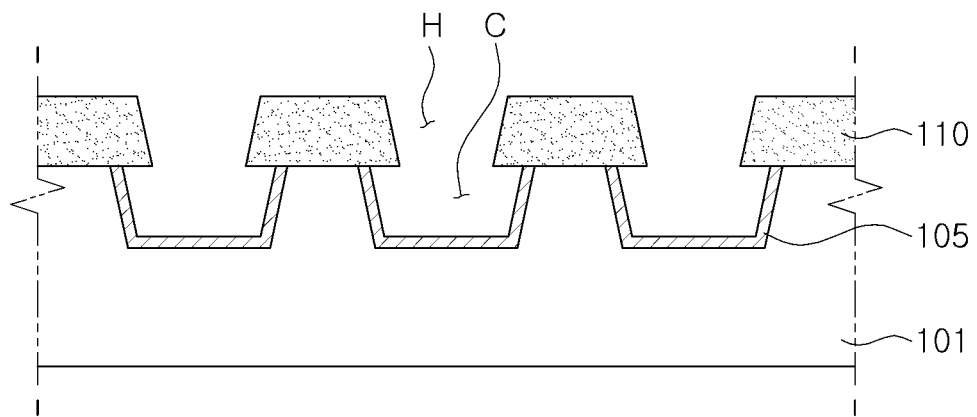
FIGS. 9 and 10 are cross-sectional views schematically illustrating major stages in a method of manufacturing a semiconductor substrate/layer according to an example embodiment.
Figure 10:
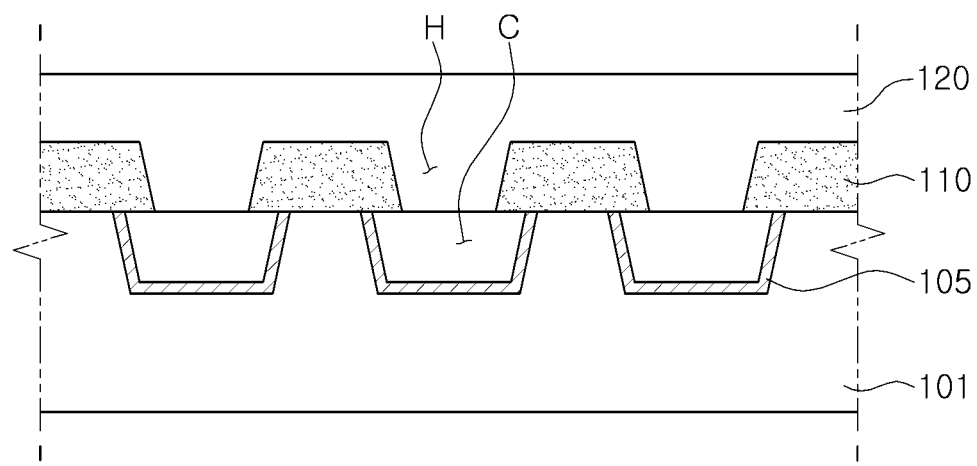

FIGS. 9 and 10 are cross-sectional views schematically illustrating major stages in a method of manufacturing a semiconductor substrate/layer according to an example embodiment.

First, as illustrated above with reference to FIGS. 1 through 3, operations for forming a substrate for semiconductor growth having a structure in which the growth substrate 101 having the cavities C formed therein and the buffer layer 110 having the openings H formed therein are stacked may be performed.

Next, referring to FIG. 9, a growth suppressing layer 105 may be formed on a surface of the growth substrate 101 exposed through the cavities C.

The growth suppressing layer 105 may be a layer preventing growth of semiconductor layer in a follow-up process. The growth suppressing layer 105 may be formed of a silicon nitride, for example. In this case, the growth suppressing layer 105 may be formed by treating the exposed surface of the growth substrate 101 with ammonia gas.

Referring to FIG. 10, the semiconductor layer 120 may be grown on the buffer layer 110.

Here, because semiconductor layer is not grown within the cavities C due to the growth suppressing layer 105, and thus, the cavities C may remain as empty spaces.

Thereafter, as described above with reference to FIG. 5, an operation of separating the growth substrate 101 may be performed.

Figure 11:
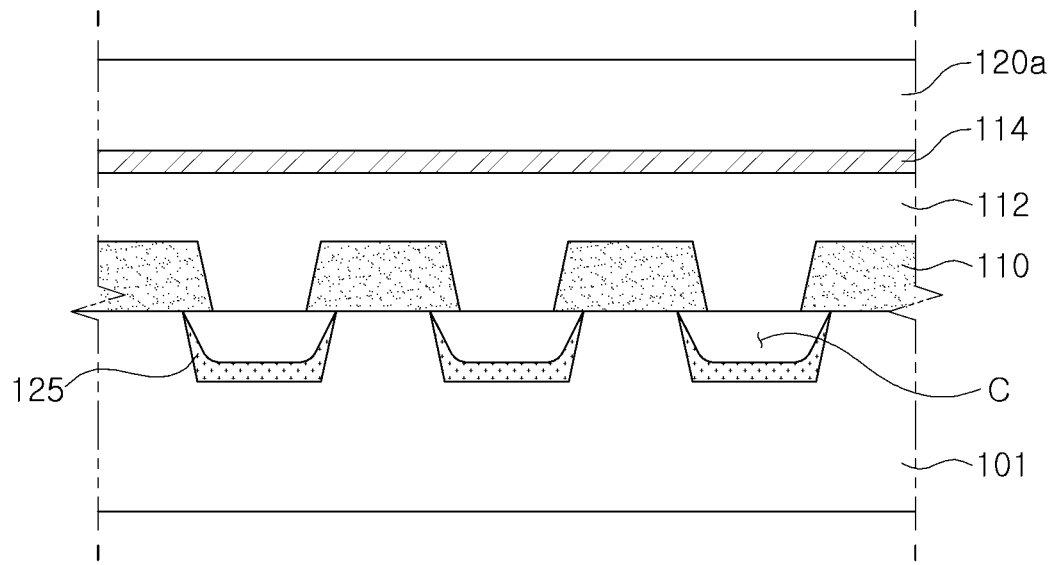
FIG. 11 is a cross-sectional view schematically illustrating a stage in a method of manufacturing a semiconductor substrate/layer according to an example embodiment.

FIG. 11 is a cross-sectional view schematically illustrating a stage in a method of manufacturing a semiconductor substrate/layer according to an example embodiment.

First, as described above with reference to FIGS. 1 through 3, operations of forming a substrate for semiconductor growth having a structure in which the growth substrate 101 having the cavities C formed therein and the buffer layer 110 having the openings H formed therein are stacked may be performed.

Next, referring to FIG. 11, after the additional buffer layers 112 and 114 are formed, a semiconductor layer 120a may be formed. The additional buffer layers 112 and 114 may be formed on the buffer layer 110 in order to further reduce defects such as dislocation or in order to reduce stress.

Compositions and/or growth conditions of the additional layers 112 and 114 may be different from those of the buffer layer 110. Also, density of a defect of the additional buffer layers 112 and 114 may be lower than that of the buffer layer 110. In an example embodiment, any one of the additional buffer layers 112 and 114 may serve as a masking layer blocking a threading dislocation, and may be formed of SiN, for example. The number of the additional buffer layers 112 and 114 is not limited to the number illustrated in the drawing and various numbers and materials may be selected according to example embodiments.

Thereafter, as described above with reference to FIG. 5, an operation of separating the growth substrate 101 from the buffer layer 110 and the additional buffer layers 112 and 114 may be performed.

Figure 12:
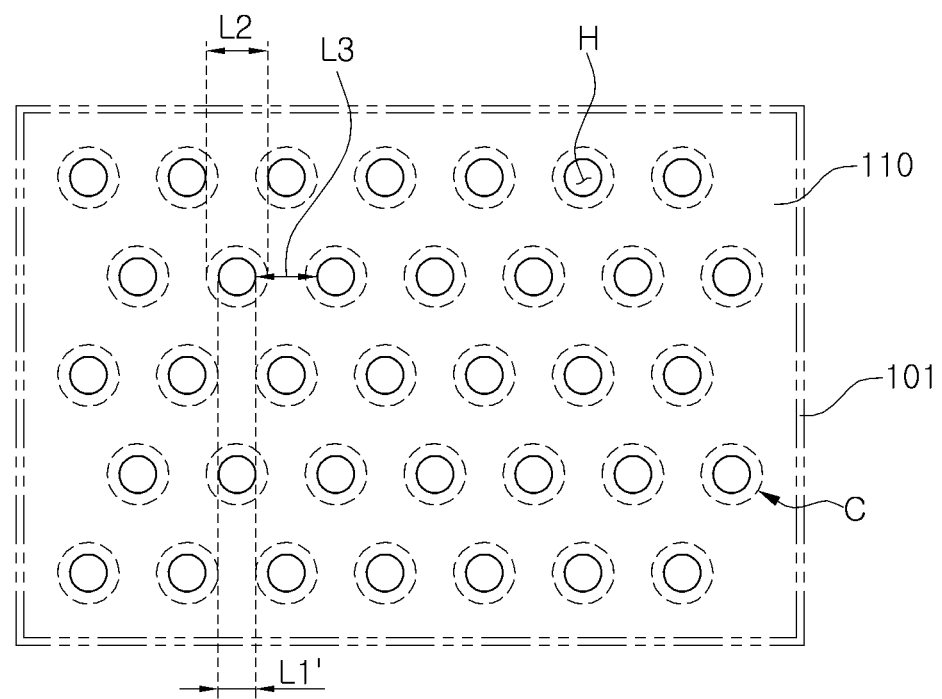
FIG. 12 is a plan view schematically illustrating a substrate for semiconductor growth according to an example embodiment.

FIG. 12 is a plan view schematically illustrating a substrate for semiconductor growth according to an example embodiment.

Referring to FIG. 12, a substrate for semiconductor growth has a structure in which the growth substrate 101 having the cavities C formed therein and the buffer layer 110 having the openings H formed therein are stacked.

The openings H and the cavities C are respectively disposed in positions corresponding to each other so as to be concentric. For example, the openings H and the cavities C may be uniformly disposed in rows and columns, and may not be limited to the illustrated arrangement. In the example embodiment, because the cavities C are uniformly formed on the entire growth substrate 101, the growth substrate 101 and the semiconductor layer 120 may be uniformly and completely separated as described above with reference to FIG. 5. Thus, even in the case that the semiconductor layer 120 is grown to have a large surface area, the semiconductor layer 120 may be effectively and stably separated.

The openings H may have a circular shape having a diameter of a first length L1' on an upper surface of the buffer layer 110, and the cavities C may have a circular shape having a diameter of a second length L2 greater than the first length L1' at an upper surface of the growth substrate 101. Here, the upper surface of the buffer layer 110 and the upper surface of the growth substrate 101 correspond surfaces provided at to the boundary B of the buffer layer 110 and the growth substrate 101 similar to the first length L1 and the second length L2 shown in FIG. 3. The first length L1' may range from fpm to 10 μm, for example, and the second length L2 may range from 3 μm to 15 μm, but the dimensions are not limited thereto.

The first length L1' and the second length L2 may be determined in consideration of a thickness of the semiconductor 120 (refer to FIG. 5) before the semiconductor layer 120 is separated. For example, in a case in which the semiconductor layer 120, which is intended to be formed, is relatively thick, the first length L1' and the second length L2 may be selected to be relatively small such that cavities C are formed to be small. Conversely, in a case in which the semiconductor layer 120, which is intended to be formed, is relatively thin, the first length L1' and the second length L2 may be selected to be relatively large such that cavities C are formed to be large.

When a distance between adjacent openings H is L3, a ratio of L1' to L3, that is, L1'/L3, may range from 0.65 to 18, for example. Thus, an area occupied by the openings H in the buffer layer 110 may be determined within a range of 20% to 90% of the area of the buffer layer 110. When the area of the openings H is smaller than the minimum value of the aforementioned range (i.e., 20%), the growth substrate 101 may be difficult to separate, and when the area of the openings H is greater than the maximum value of the aforementioned range (i.e., 90%), the semiconductor layer 120 may be difficult to grow and may be damaged while being grown.

Figure 13A:
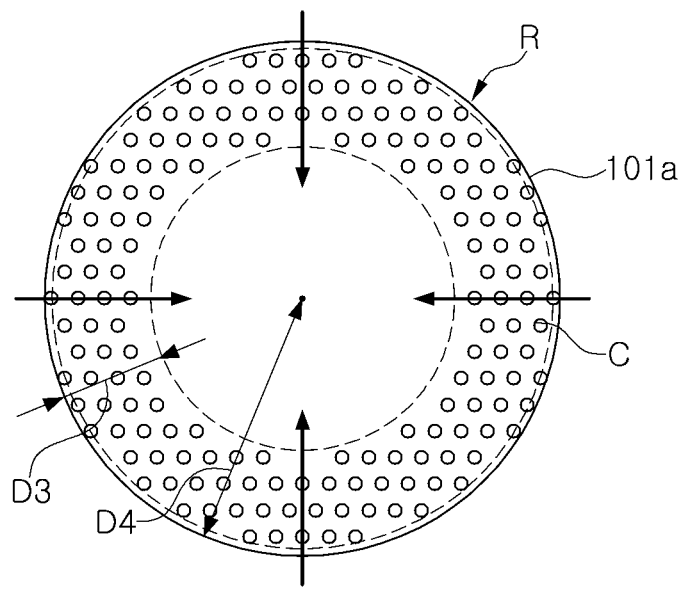
FIGS. 13A and 13B are plan views schematically illustrating a portion of a semiconductor growth substrate according to example embodiments.
Figure 13B:
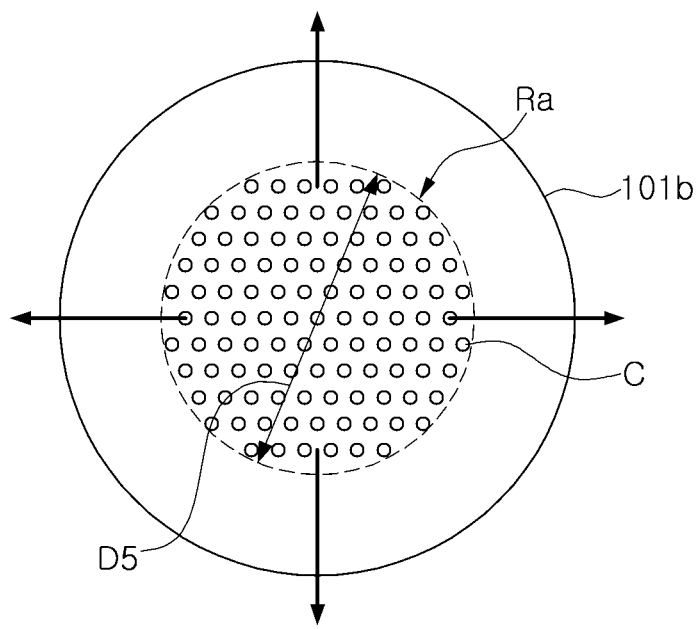

FIGS. 13A and 13B are plan views schematically illustrating a portion of a semiconductor growth substrate according to example embodiments.

Referring to FIGS. 13A and 13B, cavities C may only be formed in respective portions R and Ra of growth substrates 101a and 101b forming semiconductor growth substrates. Thus, the openings H of the buffer layer 110 (refer to FIG. 12) provided above the cavities C may also only be formed in the portions R and Ra in which the cavities C are formed.

In the example embodiments, because the cavities C are only formed in the portions R and Ra, rather than in the entirety of the growth substrates 101a and 101b, respectively, the semiconductor layer 120 (refer to FIG. 5) grown in a follow-up stage may start to be separated from one of the portions R and Ra in which the cavities C are formed. Also, when the semiconductor layer 120 is grown, even in a case in which stress and strain occurring in the semiconductor growth substrates are not uniform, the semiconductor layer 120 may be separated when the semiconductor layer 120 has an intended thickness without any defect such as cracks by adjusting positions/sizes of the portions R and Ra in which the cavities C are formed.

In the example embodiment, a thickness of the semiconductor layer 120 grown above the cavities C may be controlled by adjusting respective position and/or size of the areas of the portions R and Ra in which the cavities C are formed. The areas of the portions R and Ra in which the cavities C are formed may be less than about 70% of the overall area of the growth substrates 101a and 101b, but the example embodiments are not limited thereto. For example, in a case in which the semiconductor layer 120 is intended to be thick, the portions R and Ra in which the cavities C are formed may be formed to be small to defer a timing at which the semiconductor layer 120 is separated. In some example embodiments, a thickness of the semiconductor layer 120 with which the semiconductor layer 120 is separated may be controlled by adjusting the first length L1', the second length L2, or the ratio of L1' to L3 (L1':L3) as described above, as well as adjusting the areas of the portions R and Ra in which the cavities C are formed.

Referring to FIG. 13A, in a case in which the growth substrate 101a has a circular shape, the cavities C may only be disposed in a margin portion (or a peripheral portion) R, excluding a central portion. In this case, separation of the semiconductor layer 120 may be induced inwardly of an outer side of the growth substrate 101a as per the arrow direction shown in the figure. Even in a case in which the growth substrate 101a has a shape other than the circular shape, the portion R having cavities C may be disposed along the edges of the growth substrate 101a having the shape other than the circular shape. In the example embodiment, a width D3 of the portion R in which the cavities C are formed may be adjusted within a radius D4 of the growth substrate 101a.

Referring to FIG. 13B, when a growth substrate 101b has a circular shape, cavities C may be disposed only in the central portion Ra and may not be disposed in the margin portion (or the peripheral portion) at the circumference thereof. Thus, the separation of the semiconductor layer may be induced outwardly of the center of the growth substrate 101b as per the arrow direction shown in the figure. Even in a case in which the growth substrate 101b has a shape other than the circular shape, the cavity C formation portion Ra may only be positioned in the central portion. A width or diameter D5 of the portion Ra in which the cavities C are formed may be adjusted in example embodiments.

Figure 14:
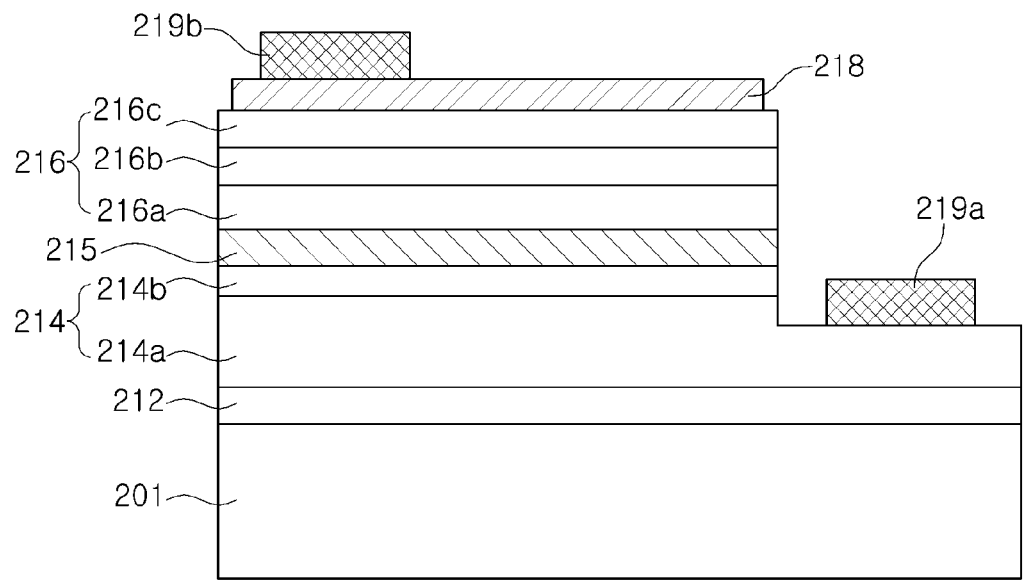
FIGS. 14 through 16 are cross-sectional views illustrating examples of a semiconductor light emitting device including a semiconductor substrate according to example embodiments.
Figure 15:
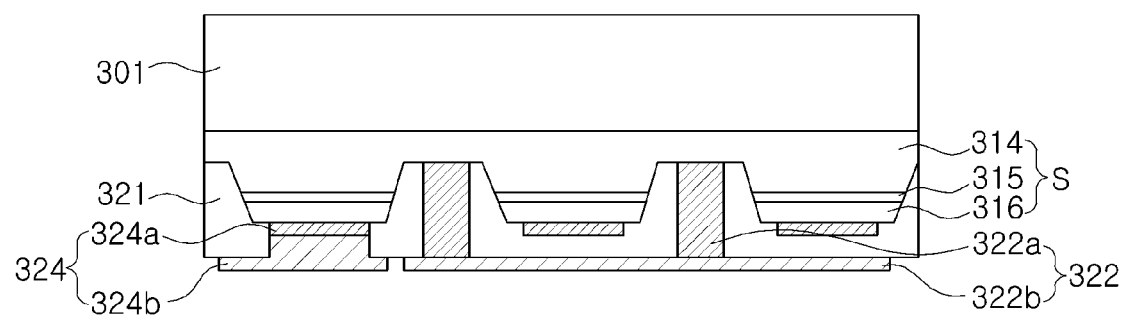
Figure 16:
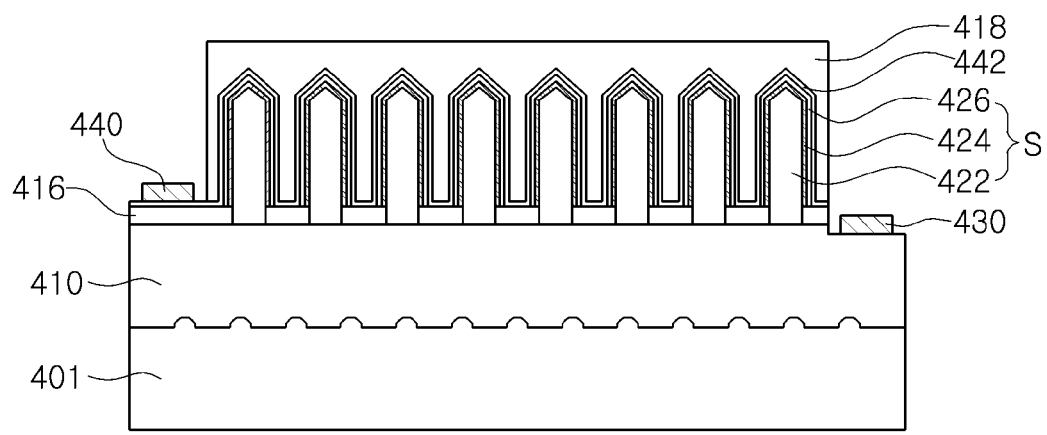

FIGS. 14 through 16 are cross-sectional views illustrating examples of a semiconductor light emitting device including a semiconductor substrate according to example embodiments.

Referring to FIG. 14, a semiconductor light emitting device 200 includes a substrate 201, and a first conductivity-type semiconductor layer 214, an active layer 215, and a second conductivity-type semiconductor layer 216 sequentially disposed on the substrate 201. The semiconductor light emitting device 200 may further include a device buffer layer 212 disposed between the substrate 201 and the first conductivity-type semiconductor layer 214. The semiconductor light emitting device 200 may further include a first electrode 219a disposed on the first conductivity-type semiconductor layer 214 and an ohmic-contact layer 218 and a second electrode 219b sequentially disposed on the second conductivity-type semiconductor layer 216.

The substrate 201 may be a GaN substrate and may be a substrate manufactured according to the method of manufacturing a semiconductor substrate according to an example embodiment described above with reference to FIGS. 1 through 13B.

The buffer layer 212 may be formed of $In_xAl_yGa_{1-x-y}N$, where $0 \leq x \leq 1$ and $0 \leq y \leq 1$. For example, the buffer layer 212 may be formed of GaN, AlN, AlGaN, or InGaN. In an example embodiment, the buffer layer 212 may be may be used by combining a plurality of layers or by gradually changing a composition as necessary.

The first conductivity-type semiconductor layer 214 may be a nitride semiconductor satisfying n-type $In_xAl_yGa_{1-x-y}N$, where $0 \leq x < 1$, $0 \leq y < 1$, and $0 \leq x+y < 1$, and an n-type impurity may be silicon (Si). For example, the first conductivity-type semiconductor layer 214 may be an n-type GaN.

In the present example embodiment, the first conductivity-type semiconductor layer 214 may include a first conductivity-type semiconductor contact layer 214a and a current spreading layer 214b. An impurity concentration of the first conductivity-type semiconductor contact layer 214a may range from $2 \times 10^{18}$ cm$^{-3}$ to $9 \times 10^{19}$ cm$^{-3}$. A thickness of the first conductivity-type semiconductor contact layer 214a may range from fpm to 5 μm. The current spreading layer 214b may have a structure in which a plurality of $In_xAl_yGa_{(1-x-y)}N$ layers, where $0 \leq x$, $y \leq 1$, and $0 \leq x+y \leq 1$, having different compositions or different impurity contents are repeatedly stacked. For example, the current spreading layer 214b may be an n-type superlattice layer formed by repeatedly stacking two or more layers having different compositions including an n-type GaN layer and/or $Al_xIn_yGa_zN$, where $0 \leq x,y,z \leq 1$, excluding $x=y=z=0$, having a thickness ranging from 1 nm to 500 nm. An impurity concentration of the current spreading layer 214b may range from $2 \times 10^{18}$ cm$^{-3}$ to $9 \times 10^{19}$ cm$^{-3}$. In an example embodiment, the current spreading layer 214b may further include an insulating material layer.

The second conductivity-type semiconductor layer 216 may be formed of nitride semiconductor satisfying p-type $In_xAl_yGa_{1-x-y}N$, where $0 \leq x < 1$, $0 \leq y < 1$, and $0 \leq x+y < 1$, and a p-type impurity may be magnesium (Mg). For example, the second conductivity-type semiconductor layer 216 may be formed to have a single layer structure or may have a multi-layer structure having different compositions as in this example. As illustrated in FIG. 14, the second conductivity-type semiconductor layer 216 may include an electron blocking layer (EBL) 216a, a p-type low-concentration GaN layer 216b, and a p-type high-concentration GaN layer 216c. For example, the electron blocking layer 216a may have a structure in which a plurality of $In_xAl_yGa_{(1-x-y)}N$ layers, where $0 \le x \le 1$, $0 \le y \le 1$, and $0 \le x+y \le 1$, having a thickness ranging from 5 nm to 100 nm and having different compositions are stacked or may be a monolayer formed of a composition of $Al_yGa_{(1-y)}N$, where $0 < y \le 1$. An energy band gap (Eg) of the electron blocking layer 216a may decrease in a direction away from the active layer 215. For example, an aluminum (Al) composition of the electron blocking layer 216a may decrease in a direction away from the active layer 215.

The active layer 215 may have a multiple quantum well (MQW) structure in which quantum well layers and quantum barrier layers are alternately stacked. For example, the quantum well layer and the quantum barrier layer may be formed of $In_xAl_yGa_{1-x-y}N$, where and $0 \le x+y \le 1$, having different compositions. In an example embodiment, the quantum well layer may be formed of $In_xGa_{1-x}N$, where $0 < x \le 1$, and the quantum barrier layer may be formed of GAN or AlGaN. Thicknesses of the quantum well layer and the quantum barrier layer may range from 1 nm to 50 nm. The active layer 215 may also have a single quantum well structure, without being limited to the multi-quantum well structure.

The first electrode 219a may include a material such as Ag, Ni, Al, Cr, Rh, Pd, Ir, Ru, Mg, Zn, Pt, or Au and may have a structure including a single layer or two or more layers. In an example embodiment, a pad electrode layer may be further provided on the first electrode 219a. The pad electrode layer may be a layer including at least one material such as gold (Au), nickel (Ni), and tin (Sn).

The ohmic-contact layer 218 may be variously configured according to a mounting structure when packaged. For example, in a case of a flip-chip structure, the ohmic-contact layer 218 may include a metal such as silver (Ag), gold (Au), or aluminum (Al) or a transparent conductive oxide such as indium tin oxide (ITO), zinc indium oxide (ZIO), or gallium indium oxide (GIO). In a case of a structure in which light is emitted upwardly in the illustrated in FIG. 14, the ohmic contact layer 218 may be configured as a translucent electrode. The translucent electrode may include either a transparent conductive oxide layer or a nitride layer. For example, the translucent electrode may be at least one selected from among ITO, zinc-doped indium tin oxide (ZITO), ZIO, GIO, zinc tin oxide (ZTO), fluorine-doped tin oxide (FTC)), aluminum-doped zinc oxide (AZO), gallium-doped zinc oxide (GZO), $In_4Sn_3O_{12}$, and $Zn_{(1-x)}Mg_xO$ (Zinc Magnesium Oxide, where $0 \le x \le 1$). In an example embodiment, the ohmic-contact layer 218 may include graphene. The second electrode 219b may include at least one of Al, Au, Cr, Ni, Ti, and Sn.

Referring to FIG. 15, a semiconductor light emitting device 300 includes a substrate 301 and a semiconductor stacked body S formed on the substrate 301. The semiconductor stacked body S may include a first conductivity-type semiconductor layer 314, an active layer 315, and a second conductivity-type semiconductor layer 316. The semiconductor light emitting device 300 may further include first and second electrodes 322 and 324 respectively connected to the first and second and second conductivity-type semiconductor layers 314 and 316.

The substrate 301 may be a GaN substrate and may be a substrate manufactured according to the method of manufacturing a semiconductor substrate according to an example embodiment described above with reference to FIGS. 1 through 13B.

The first electrode 322 may include a connection electrode portion 322a connected to the first conductivity-type semiconductor layer 314 through the second conductivity-type semiconductor layer 316 and the active layer 315, and a first electrode pad 322b connected to the connection electrode portion 322a. The connection electrode portion 322a may be surrounded by an insulating portion 321 so as to be electrically separated from the active layer 315 and the second conductivity-type semiconductor layer 316. The connection electrode portion 322a may be disposed in a region formed by etching the semiconductor stacked body S. The amount, shape, and pitch of the connection electrode portion 322a and a contact area of the connection electrode portion 322a with the first conductivity-type semiconductor layer 314, may be appropriately designed such that contact resistance is reduced. The connection electrode portion 322a may be arranged in rows and columns on the semiconductor stacked body S in order to improve a current flow.

The second electrode 324 may include an ohmic contact layer 324a and a second electrode pad 324b on the second conductivity-type semiconductor layer 316. The connection electrode portion 322a and the ohmic-contact layer 324a have a monolayer or a multi-layer structure formed of a conductive material having ohmic characteristics with respect to the first and second conductivity-type semiconductor layers 314 and 316. For example, the connection electrode portion 322a and the ohmic-contact layer 324a may be formed of at least one material among silver (Ag), aluminum (Al), nickel (Ni), chromium (Cr), and a transparent conductive oxide (TCO).

The first and second electrode pads 322b and 324b may be respectively connected to the connection electrode portion 322a and the ohmic contact layer 324a to serve as external terminals of the semiconductor light emitting device 300. For example, the first and second electrode pads 322b and 324b may include Au, Ag, Al, Ti, W, Cu, Sn, Ni, Pt, Cr, NiSn, TiW, AuSn, or a eutectic metal thereof. The first and second electrodes 322 and 324 may be disposed in the same direction, thereby mounting the semiconductor light emitting device 300 on a lead frame in a flipchip manner, or the like.

The first and second electrodes 322 and 324 may be electrically separated by an insulating portion 321. The insulating portion 321 may be formed of an insulating material, and here, a material having low light absorption may be used. For example, the insulating portion 321 may be formed of a silicon oxide or a silicon nitride such as $SiO_2$, $SiO_xN_y$, or $Si_xN_y$.

In an example embodiment, the insulating portion 321 may have a light reflective structure in which a light reflective filler is dispersed in a translucent material. Alternatively, the insulating layer 321 may have a multilayer reflective structure in which a plurality of insulating layers having different refractive indices are alternately stacked. For example, such a multilayer reflective structure may be a distributed Bragg reflector (DBR) in which a first insulating layer having a first refractive index and a second insulating layer having a second refractive index are alternatively stacked. The multilayer reflective structure may have a structure in which a plurality of insulating layers, having different refractive indices, are repeatedly stacked two to one hundred times. The plurality of insulating layers may each be an oxide or a nitride such as $SiO_2$, SiN, $SiO_xN_y$, $TiO_2$, $Si_3N_4$, $Al_2O_3$, TiN, AlN, $ZrO_2$, TiAlN, or TiSiN, or combinations thereof. For example, when a wavelength of light generated by the active layer 315 is λ and n is a refractive index of a corresponding insulating layer, the first insulating layer and the second insulating layer may be formed to have a thickness of λ/4 n and may have a thickness of about 300 Å to 900 Å. Here, the multilayer reflective structure may be designed by selecting refractive indices and thicknesses of the first insulating layer and the second insulating layer such that a level of reflectivity of 95% or greater is obtained with respect to a wavelength of light generated by the active layer 315. The refractive indices of the first insulating layer and the second insulating layer may be determined within a range of about 1.4 to 2.5 and may have a value smaller than that of the first conductivity-type semiconductor layer 314.

Referring to FIG. 16, a semiconductor light emitting device 400 includes a substrate 401 and a light emitting nanostructure S disposed on the substrate 401. The light emitting nanostructure S may include a first conductivity-type semiconductor core 422, an active layer 424, and a second conductivity-type semiconductor layer 426. Also, the semiconductor light emitting device 400 may further include a base layer 410 and an insulating layer 416 disposed between the substrate 401 and the light emitting nanostructure S, a transparent electrode layer 442 and a filler layer 418 covering the light emitting nanostructure S, and first and second electrodes 430 and 440 as electrode structures.

The substrate 401 may be a GaN substrate and may be a substrate manufactured according to the method of manufacturing a semiconductor substrate according to an example embodiment described above with reference to FIGS. 1 through 13B.

The base layer 410 may be disposed on the substrate 401. The base layer 410 may be formed of a Group III-V compound and may be formed of, for example, GaN. The base layer 410 may be formed of n-GaN doped with an n-type impurity, for example. In the present example embodiment, the base layer 410 may be commonly connected to one side of the light emitting nanostructures S to serve as a contact electrode, as well as providing a crystal plane allowing the first conductivity-type semiconductor core 422 to be grown thereon.

The insulating layer 416 may be disposed on the base layer 410. The insulating layer 416 may be formed of a silicon oxide or a silicon nitride, and may be formed of at least one of $SiO_x$, $SiO_xN_y$, $Si_xN_y$, $Al_2O_3$, TiN, AlN, ZrO, TiAlN, and TiSiN, for example. The insulating layer 416 includes a plurality of openings exposing portions of the base layer 410. A diameter, a length, a position, and growth conditions of the light emitting nanostructures S may be determined depending on a size of the plurality of openings. The plurality of openings may have various shapes such as a circular, quadrangular, or hexagonal shape.

The plurality of light emitting nanostructures S may be disposed in positions corresponding to the plurality of openings. The light emitting nanostructures S may have a core-shell structure including first conductivity-type semiconductor cores 422 grown from the base layer 410 exposed by the plurality of openings and an active layer 424 and a second conductivity-type semiconductor layer 426 sequentially formed on the surfaces of the first conductivity-type semiconductor cores 422.

The number of the light emitting nanostructures S included in the semiconductor light emitting device 400 is not limited to that illustrated in the drawing, and the semiconductor light emitting device 400 may include tens to millions of light emitting nanostructures S. Each of the light emitting nanostructures S of the present example embodiment may include a lower hexagonal prismatic region and an upper hexagonal pyramidal region. According to an example embodiment, the light emitting nanostructures S may have a pyramidal shape or a columnar shape. Because the light emitting nanostructures S have such a three-dimensional (3D) shape, light emitting surface area thereof may be relatively large, increasing luminous efficiency.

The transparent electrode layer 442 may be disposed to cover upper and side surfaces of the light emitting nanostructures S and may be connected between adjacent light emitting nanostructures S. The transparent electrode layer 442 may be, for example, indium tin oxide (ITO), aluminum zinc oxide (AZO), indium zinc oxide (IZO), ZnO, GZO (ZnO:Ga), $In_2O_3$, $SnO_2$, CdO, $CdSnO_4$, or $Ga_2O_3$.

The filler layer 418 may be disposed to fill spaces between the adjacent light emitting nanostructures S and cover the light emitting nanostructures S and the transparent electrode layer 442 on the light emitting nanostructures S. The filler layer 418 may be formed of a translucent insulating material and may include, for example, $SiO_2$, $SiN_x$, $Al_2O_3$, HfO, $TiO_2$, or ZrO.

The first and second electrodes 430 and 440 may be disposed on the base layer 410 and the transparent electrode layer 442 so as to be electrically connected to the base layer 410 and the second conductivity-type semiconductor layer 424, respectively.

In the semiconductor light emitting devices 200, 300, and 400 described above, because the GaN substrate manufactured according to an example embodiment is used as the substrates 201, 301, and 401, crystal quality of the semiconductor layers including the active layers 215, 315, and 424 formed thereabove may be secured, compared with a case of using other substrate such as a sapphire substrate, and thus, characteristics of the semiconductor light emitting devices 200, 300, and 400 may be enhanced. In addition, because the substrates 201, 301, and 401 may be formed as large substrates, the semiconductor light emitting devices 200, 300, and 400 and semiconductor light emitting device packages 600, 700, and 800 described hereinafter may be manufactured in a wafer level.

Figure 17:
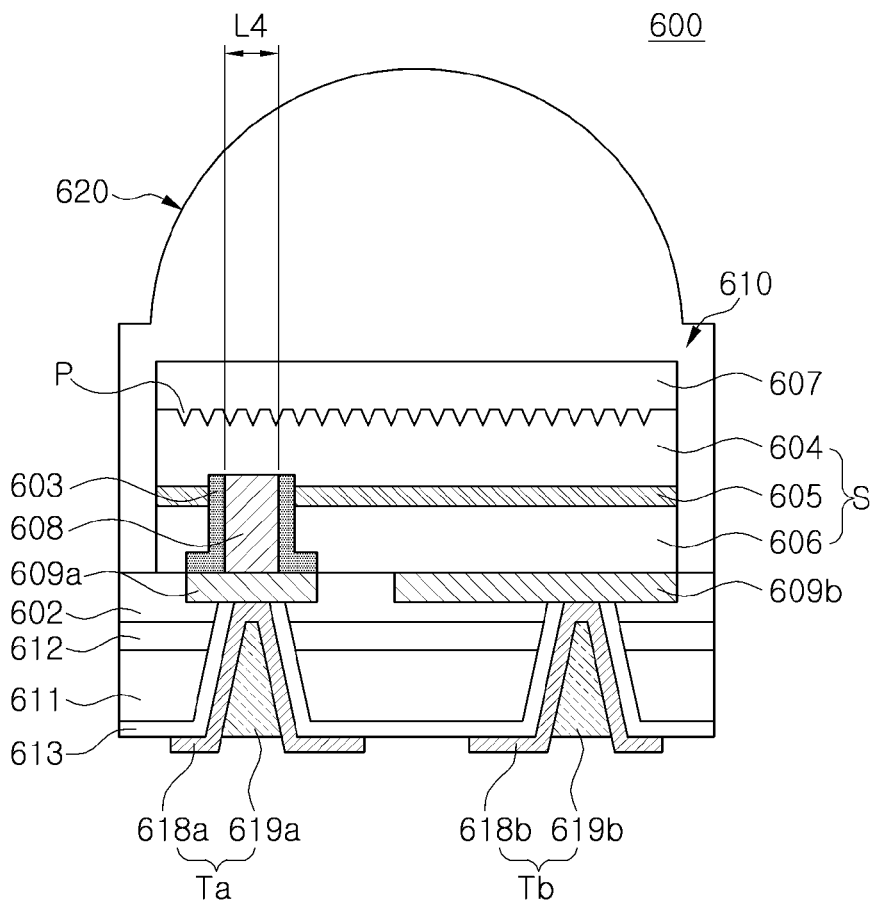
FIGS. 17 through 19 are views illustrating examples of applying a semiconductor light emitting device including a semiconductor substrate according to example embodiments of the present inventive concept to a package.
Figure 18:
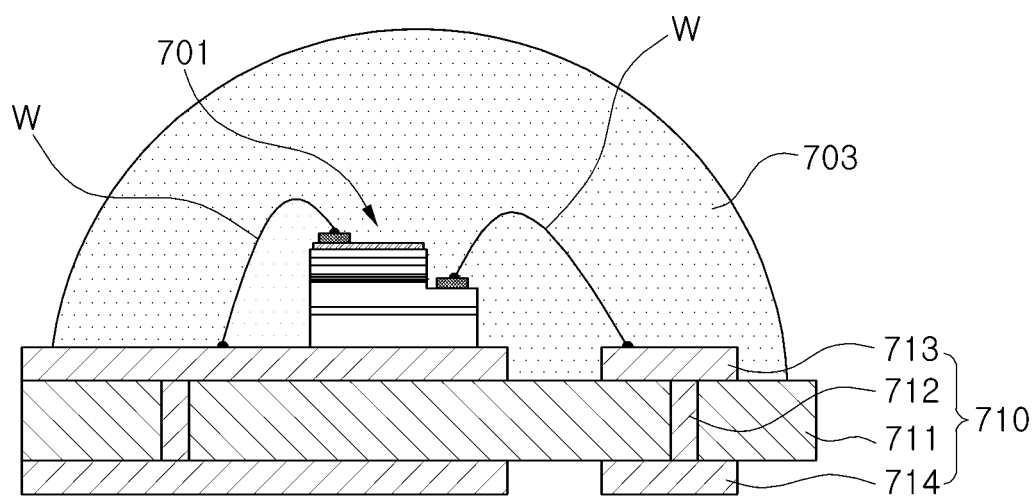
Figure 19:
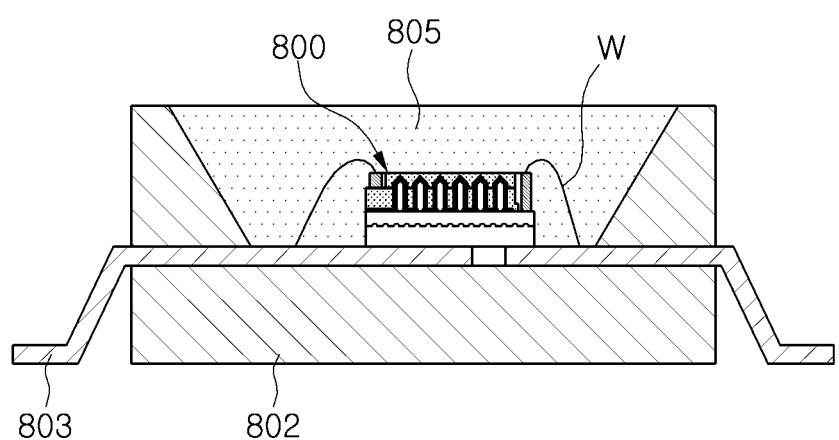

FIGS. 17 through 19 are views illustrating examples of applying a semiconductor light emitting device including a semiconductor substrate according to example embodiments to a package.

Referring to FIG. 17, a semiconductor light emitting device package 600 includes a light emitting stacked body S disposed on a mounting board 611, first and second terminals Ta and Tb, a phosphor layer 607, and a lens 620. In the semiconductor light emitting device package 600, an electrode is formed on a lower surface of a light emitting device 610, opposite to a main light extraction surface, and the phosphor layer 607 and the lens 620 are integrally formed to have a chip scale package (CSP) structure.

The light emitting stacked body S may include first and second conductivity-type semiconductor layers 604 and 606 and an active layer 605 disposed therebetween. The first and second conductivity-type semiconductor layers 604 and 606 may be an n-type semiconductor layer and an p-type semiconductor layer, respectively, and may be formed of a nitride semiconductor, e.g., $Al_xIn_yGa_{(1-x-y)}N$, where 0<x<1, 0<y<1, and 0<x+y<1. However, in addition to the nitride semiconductor, a GaAs-based semiconductor or GaP-based semiconductor may also be used.

The active layer 605 formed between the first and second conductivity-type semiconductor layers 604 and 606 may emit light having a predetermined level of energy according to electron-hole recombination, and may have a multiple quantum well (MQW) structure in which quantum well layers and quantum barrier layers are alternately stacked. In the case of the MQW structure, for example, an InGaN/GaN or AlGaN/GaN structure may be used.

The semiconductor light emitting device 610 is in a state in which a substrate was removed, and an irregular pattern P may be formed on the surface from which the substrate was removed. Also, a phosphor layer 607 may be disposed on the surface with the irregular pattern P formed thereon as a light conversion layer. The substrate may be the substrate manufactured according to the method of manufacturing a semiconductor substrate according to an example embodiment described above with reference to FIGS. 1 through 13B. In an example embodiment, the substrate may not be removed and the irregular pattern P and the light conversion layer may be formed on a rear surface of the substrate.

First and second electrodes 609a and 609b may be connected to the first and second conductivity-type semiconductor layers 604 and 606, respectively. The first electrode 609a may have a conductive via 608 connected to the first conductivity-type semiconductor layer 604 through the second conductivity-type semiconductor layer 606 and the active layer 605. A short-circuit with respect to the active layer 605 and the second conductivity-type semiconductor layer 606 may be prevented by an insulating layer 603 surrounding the conductive via 608. In the present example embodiment, a single conductive via 608 is illustrated, but a plurality of conductive vias may be provided and arranged to have various forms in order to facilitate current spreading. In addition, a diameter L4 of the conductive via 608 may be determined in consideration of an area of the light emitting stacked body S.

The mounting board 611 may be a substrate such as a silicon substrate to which a semiconductor process may be easily applicable, but a material of the substrate 611 is not limited thereto. The mounting board 611 and the light emitting device 610 may be bonded by bonding layers 602 and 612. The bonding layers 602 and 612 may be formed of an electrically insulating material or a conductive material. For example, the bonding layers 602 and 612 may be formed of an oxide such as $SiO_2$ or SiN, a resin material such as a silicon resin or an epoxy resin, or silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal alloy thereof.

In an example embodiment, the first and second electrodes 609a and 609b may be connected to the first and second terminals Ta and Tb without the bonding layers 602 and 612. In an example embodiment, the first and second electrodes 609a and 609b may be formed of a plurality of metal layers. For example, the first and second electrodes 609a and 609b may include an under bump metallurgy (UBM) layer including a solder pad and a solder bumper layer. In this case, the mounting board 611, the bonding layers 602 and 612, and the first and second terminals Ta and Tb may be omitted.

Referring to FIG. 18, a semiconductor light emitting package 700 may include a semiconductor light emitting device 701, a mounting board 710, and an encapsulant 703 having the same structure as that illustrated in FIG. 14.

The semiconductor light emitting device 701 may be mounted on the mounting board 710 and electrically connected to the mounting board 710 through wires W. The mounting board 710 may include a board main body 711, an upper electrode 713, a lower electrode 714, and a through electrode 712 connecting the upper electrode 713 and the lower electrode 714. The main body of the mounting board 710 may be formed of a resin, ceramics or a metal, and the upper or lower electrode 713 or 714 may be a metal layer formed of a metal such as Au, Cu, Ag, or Al. For example, the mounting board 710 may be provided as a board such as printed circuit board (PCB), metal-core printed circuit board (MCPCB), a metal base printed circuit board (MPCB), a flexible printed circuit board (FPCB), or the like, and the structure of the mounting board 710 may be applied in various forms.

The encapsulant 703 may be formed to have a lens structure with an upper surface having a convex dome shape. However, according to an example embodiment, the encapsulant 703 may have a lens structure having a convex or concave surface to adjust a beam angle of light emitted through the upper surface of the encapsulant 703.

Referring to FIG. 19, a semiconductor light emitting device package 800 may include a semiconductor light emitting device 801, a package body 802, and a pair of lead frames 803 having the same structure as that illustrated in FIG. 16.

The semiconductor light emitting device 801 may be mounted on the lead frames 803 and electrically connected to the lead frames 803 through wires W. In an example embodiment, the semiconductor light emitting device 801 may be mounted on a region, other than the lead frame 803, for example, on a package body 802. Also, the package body 802 may have a recess having a cup shape to improve reflectivity of light. An encapsulant 805 formed of a light-transmissive material may be formed in the recess to encapsulate the semiconductor light emitting device 801 and the wires W. In an example embodiment, the encapsulant 805 may contain a wavelength conversion material such as a phosphor and/or a quantum dot.

Figure 20A:
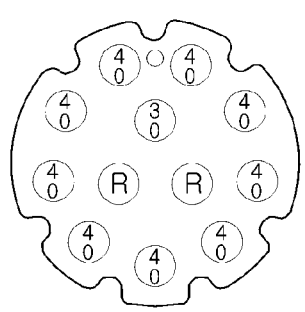
FIGS. 20A and 20B are views schematically illustrating a white light source module according to example embodiments.
Figure 20B:
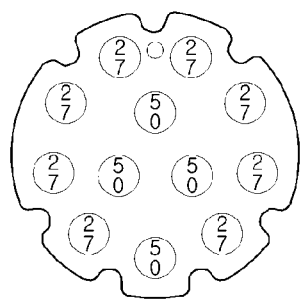

FIGS. 20A and 20B are views schematically illustrating white light source modules according to example embodiments.

Light source modules illustrated in FIGS. 20A and 20B may include a plurality of light emitting device packages mounted on a circuit board. A plurality of light emitting device packages mounted on a single white light source module may be configured as homogenous packages generating light having the same wavelength, or the plurality of light emitting device packages mounted on a single light source module may be configured as heterogeneous packages generating light having different wavelengths.

Referring to FIG. 20A, a white light source module may be configured by combining white light emitting device packages 40 and 30 respectively having color temperatures of 4000K and 3000K and a red light emitting device package (indicated as "R"). The white light source module may provide white light having a color temperature that may be adjusted to range from 3000K to 4000K and having a color rendering index (CRI) Ra ranging from 85 to 100.

In an example embodiment, a white light source module may include only white light emitting device packages in which a portion of the packages may emit white light having a color temperature different from those of FIG. 20A. For example, as illustrated in FIG. 20B, a white light emitting device package 27 having a color temperature of 2700K and a white light emitting device package 50 having a color temperature of 5000K may be combined to provide white light having a color temperature that may be adjusted to range from 2700K to 5000K and having a CRI Ra ranging from 85 to 99. Here, the amount of light emitting device packages of each color temperature may vary mainly depending on a basically set color temperature value. For example, in a case of a lighting device in which a basically set value is a color temperature of about 4000K, the amount of packages corresponding to 4000K may be greater than that of a color temperature of 3000K or the amount of red light emitting device packages.

In this manner, the heterogeneous light emitting device packages may be configured to include at least one of purple, blue, green, red, and infrared light emitting device packages in a light emitting device package emitting white light by combining yellow, green, red, or orange phosphors with a blue light emitting device, whereby a color temperature and CRI of white light may be adjusted.

Figure 22:
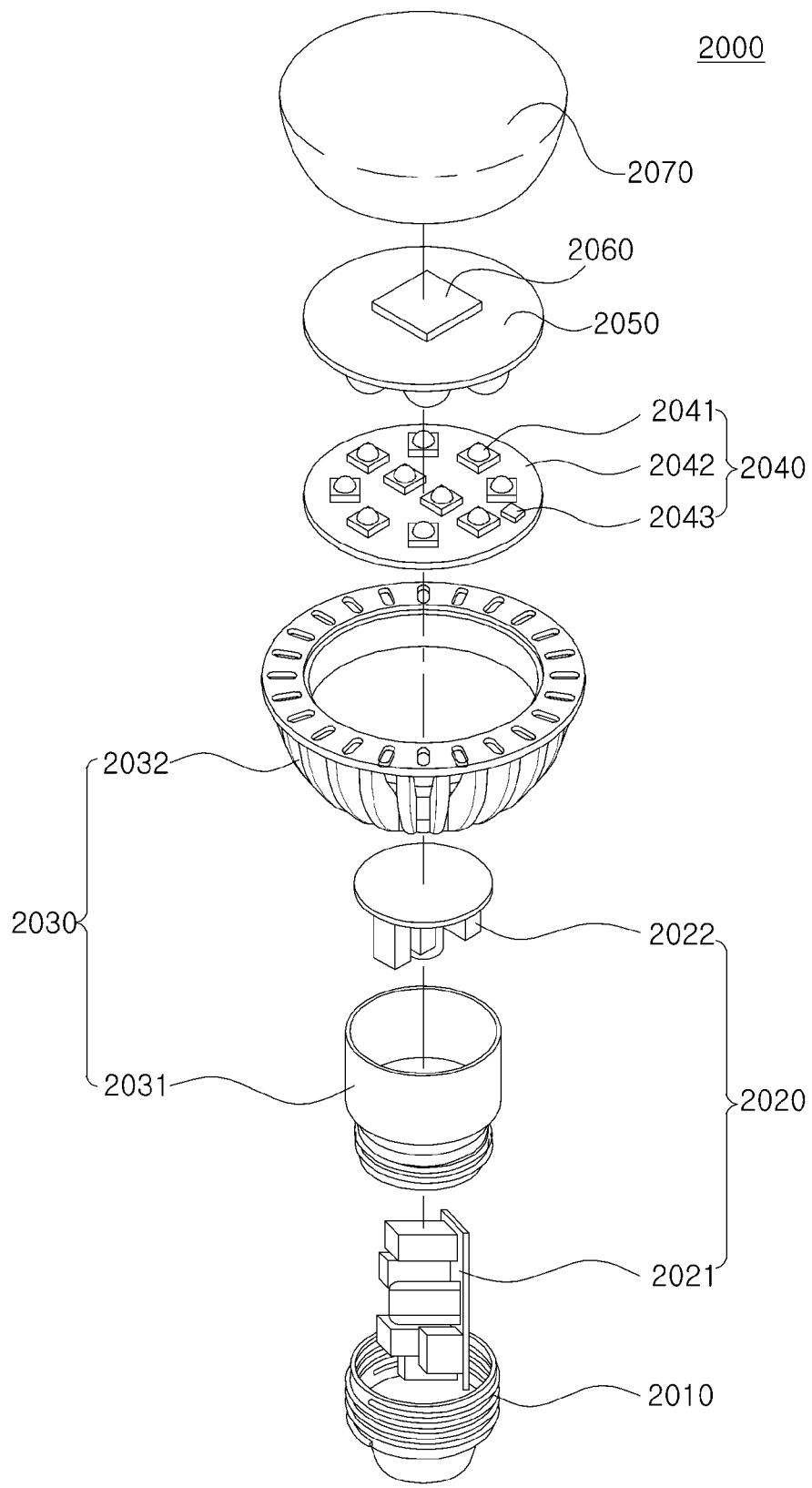
FIG. 22 is an exploded perspective view schematically illustrating a bulb type lamp including a communications module, as a lighting device, according to an example embodiment.

The white light source module described above may be used as the light source module 2040 of the bulb-type lighting device 2000 (refer to FIG. 22).

In a single light emitting device package, light having a desired color may be determined according to wavelengths of an LED chip as a light emitting device and types and mixing ratios of phosphors. In a case of a white light emitting device package, a color temperature and a CRI may be adjusted thereby.

For example, in a case in which an LED chip emits blue light, a light emitting device package including at least one of yellow, green, and red phosphors may emit white light having various color temperatures according to mixing ratios of phosphors. In contrast, a light emitting device package in which a green or red phosphor is applied to a blue LED chip may emit green or red light. In this manner, a color temperature or a CRI of white light may be adjusted by combining a light emitting device package emitting white light and a light emitting device package emitting green or red light. Also, a light emitting device package may be configured to include at least one of light emitting devices emitting purple, blue, green, red, or infrared light.

In this case, the lighting device may control a color rendering index (CRI) to range from the level of light emitted by a sodium lamp to the level of sunlight, and may control a color temperature ranging from 1500K to 20000K to generate various levels of white light. If necessary, the lighting device may generate visible light having purple, blue, green, red, orange colors, or infrared light to adjust an illumination color according to a surrounding atmosphere or mood. Also, the lighting device may generate light having a special wavelength stimulating plant growth.

Figure 21:
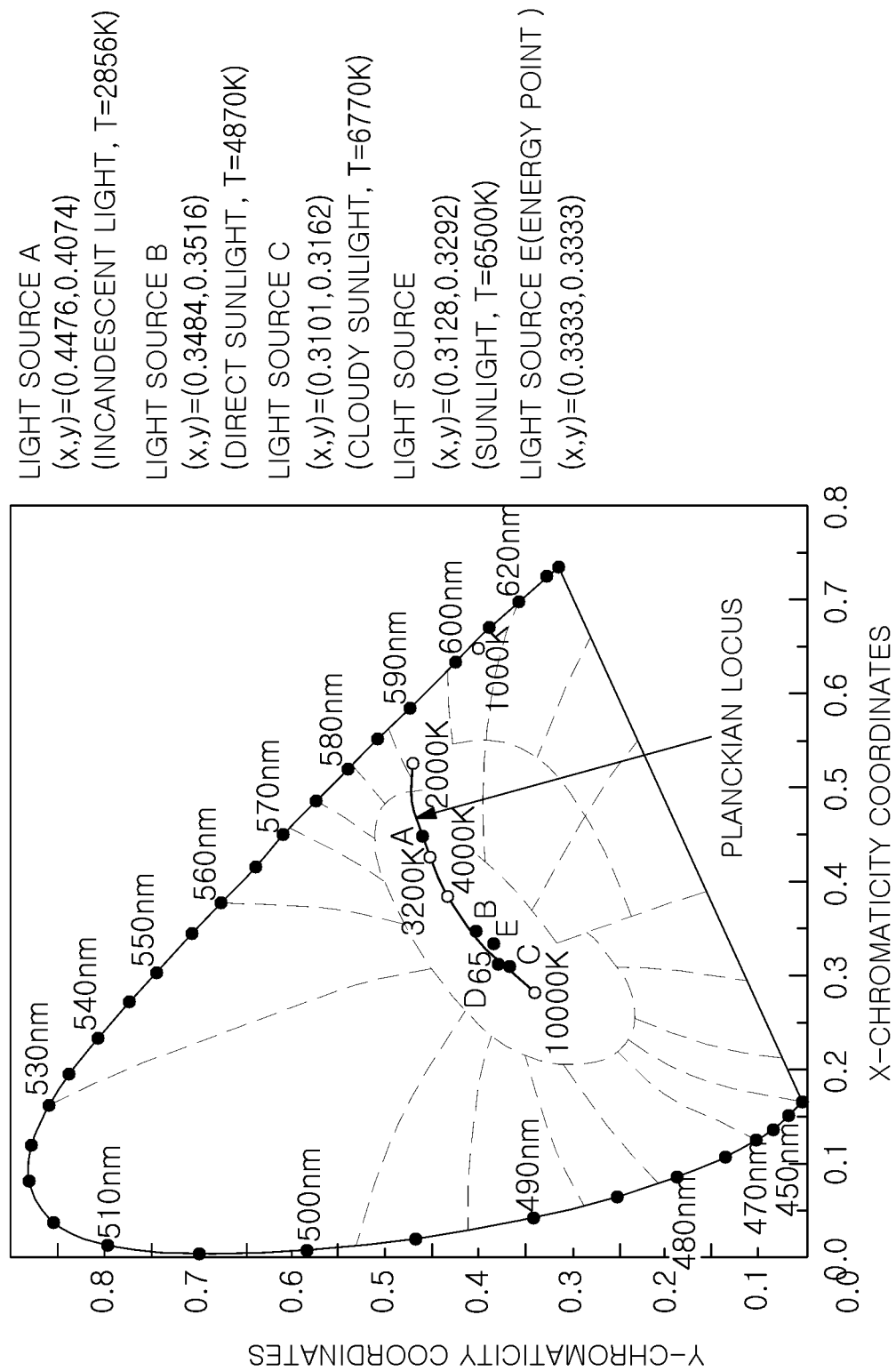
FIG. 21 is a CIE 1931 color space chromaticity diagram illustrating wavelength conversion materials that may be employed in a semiconductor light emitting device package according to an example embodiment.

White light generated by combining yellow, green, and red phosphors to a blue light emitting device and/or by combining green and red light emitting devices thereto may have two or more peak wavelengths, and, as illustrated in FIG. 21, (x,y) coordinates may be positioned in a segment linking (0.4476, 0.4074), (0.3484, 0.3516), (0.3101, 0.3162), (0.3128, 0.3292), (0.3333, 0.3333) of the CIE 1931 chromaticity diagram. Alternatively, the (x,y) coordinates may be positioned in a region surrounded by the segment and a spectrum of black body radiation. A color temperature of white light corresponds to a range from about 1500K to about 20000K. In FIG. 21, white light in the vicinity of the point E (0.3333, 0.3333) present in a lower portion of the spectrum of black body radiation is in a state in which light of a yellow component is relatively weak, which may be used as a light source for illumination in a region which a vivid or fresh feeling for the naked eye is provided. Thus, lighting products using white light in the vicinity of the point E (0.3333, 0.3333) in the lower portion of the spectrum of black body radiation may be effectively used as lighting of stores selling groceries or clothes.

Various materials such as phosphors and/or quantum dots may be used as materials for converting a wavelength of light emitted from the semiconductor light emitting device.

Phosphors may have the following empirical formulas and colors:

Oxides: Yellow and green $Y_3Al_5O_{12}:Ce$, $Tb_3Al_5O_{12}:Ce$, $Lu_3Al_5O_{12}:Ce$ Silicates: Yellow and green $(Ba,Sr)_2SiO_4:Eu$, yellow and orange $(Ba,Sr)_3SiO_5:Ce$ Nitrides: Green $\beta$-SiAlON:Eu, yellow $La_3Si_6N_{11}:Ce$, orange $\alpha$-SiAlON:Eu, red $CaAlSiN_3:Eu$, $Sr_2Si_5N_8:Eu$, $SrSiAl_4N_7:Eu$, $SrLiAl_3N_4:Eu$, $Ln_{4-x}(Eu_zM_{1-z})_xSi_{12-y}Al_yO_{3+x+y}N_{18-x-y}$, where $0.5 \le x \le 3$, $0 < z < 0.3$, and $0 < y \le 4$ (Here, Ln may be at least one type of element selected from the group consisting of Group IIIa elements and rare earth elements, and M may be at least one type of element selected from the group consisting of calcium (Ca), barium (Ba), strontium (Sr), and magnesium (Mg)).

Fluorides: KSF-based red $K_2SiF_6:Mn_4^+$, $K_2TiF_6:Mn_4^+$, $NaYF_4:Mn_4^+$, $NaGdF_4:Mn_4^+$, $K_3SiF_7:Mn^{4+}$ Phosphor compositions should basically conform with Stoichiometry, and respective elements may be substituted with different elements of respective groups of the periodic table. For example, strontium (Sr) may be substituted with barium (Ba), calcium (Ca), magnesium (Mg), and the like, of alkali earths, and yttrium (Y) may be substituted with terbium (Tb), Lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

In particular, in order to enhance reliability at high temperatures and high humidity, the fluoride-based red phosphor may be coated with a fluoride not containing manganese (Mn) or further include an organic substance coated on a surface of the fluoride coating not containing manganese (Mn). Unlike any other phosphor, the fluoride-based red phosphor may realize a narrow full width at half maximum (FWHM) equal to or less than 40 nm, and thus, it may be utilized in high resolution TVs such as UHD TVs.

Table 1 below illustrates types of phosphors in applications fields of white light emitting devices using a blue LED chip (wavelength: 440 nm to 460 nm or a UV LED chip (wavelength: 380 nm to 440 nm).

TABLE 1

| Purpose | Phosphor |
| --- | --- |
| LED TV BLU | $\beta$-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |
| Lighting | $Lu_3Al_5O_{12}$:$Ce^{3+}$, Ca-$\alpha$-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |
| Side viewing (Mobile devices, Notebook PCs) | $Lu_3Al_5O_{12}$:$Ce^{3+}$, Ca-$\alpha$-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, (Sr, Ba, Ca, Mg)$_2$SiO$_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |
| Electrical components (Headlamps, etc.) | $Lu_3Al_5O_{12}$:$Ce^{3+}$, Ca-$\alpha$-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |

Also, the wavelength conversion unit may be formed of wavelength conversion materials such as quantum dots (QD), and here, the quantum dots may be used in place of phosphors or may be mixed with phosphors so as to be used.

FIG. 22 is an exploded perspective view schematically illustrating a bulb type lamp including a communications module, as a lighting device, according to an example embodiment.

Referring to FIG. 22, a lighting device 2000 may include a socket 2010, a power source unit 2020, a heat dissipation unit 2030, a light source module 2040, and a cover unit 2070.

Power supplied to the lighting device 2000 may be applied through the socket 2010. The socket 2010 may be configured to be replaced with an existing lighting device. As illustrated, the power source unit 2020 may include a first power source unit 2021 and a second power source unit 2022. The first power source unit 2021 and the second power source unit 2022 may be coupled to form the power source unit 2020. The heat dissipation unit 2030 may include an internal heat dissipation unit 2031 and an external heat dissipation unit 2032. The internal heat dissipation unit 2031 may be directly connected to the light source module 2040 and/or the power source unit 2020 to transmit heat to the external heat dissipation unit 2032. The cover unit 2070 may be configured to evenly distribute light emitted from the light source module 2040.

The light source module 2040 may emit light to the cover unit 2070 upon receiving power from the power source unit 2020. The light source module 2040 may include one or more light emitting devices 2041, a circuit board 2042, and a controller 2043. The controller 2043 may store driving information of the light emitting devices 2041. The light emitting devices 2041 may each include the substrate manufactured according to the method of manufacturing a semiconductor substrate according to an example embodiment described above with reference to FIGS. 1 through 13B, or may be devices manufactured using the same.

A reflective plate 2050 is provided above the light source module 2040, and here, the reflective plate 2050 serves to allow light from the light source to be evenly spread laterally and backwardly, reducing glare (dazzle).

A communications module 2060 may be mounted on an upper portion of the reflective plate 2050, and home network communications may be realized through the communications module 2060. For example, the communications module 2060 may be a wireless communications module using ZigBee™, Wi-Fi, or visible light communications (VLC) technology (or light fidelity (Li-Fi)), and control lighting installed within or outside of a household, such as turning a lighting device on or off, adjusting brightness of a lighting device, and the like, through a smartphone or a wireless controller. Also, home appliances or an automobile system within or outside of a household, such as a TV, a refrigerator, an air-conditioner, a door lock, or automobiles, and the like, may be controlled through a Li-Fi communications module using visible wavelengths of the lighting device installed within or outside of the household. The reflective plate 2050 and the communications module 2060 may be covered by the cover unit 2070.

Figure 23:
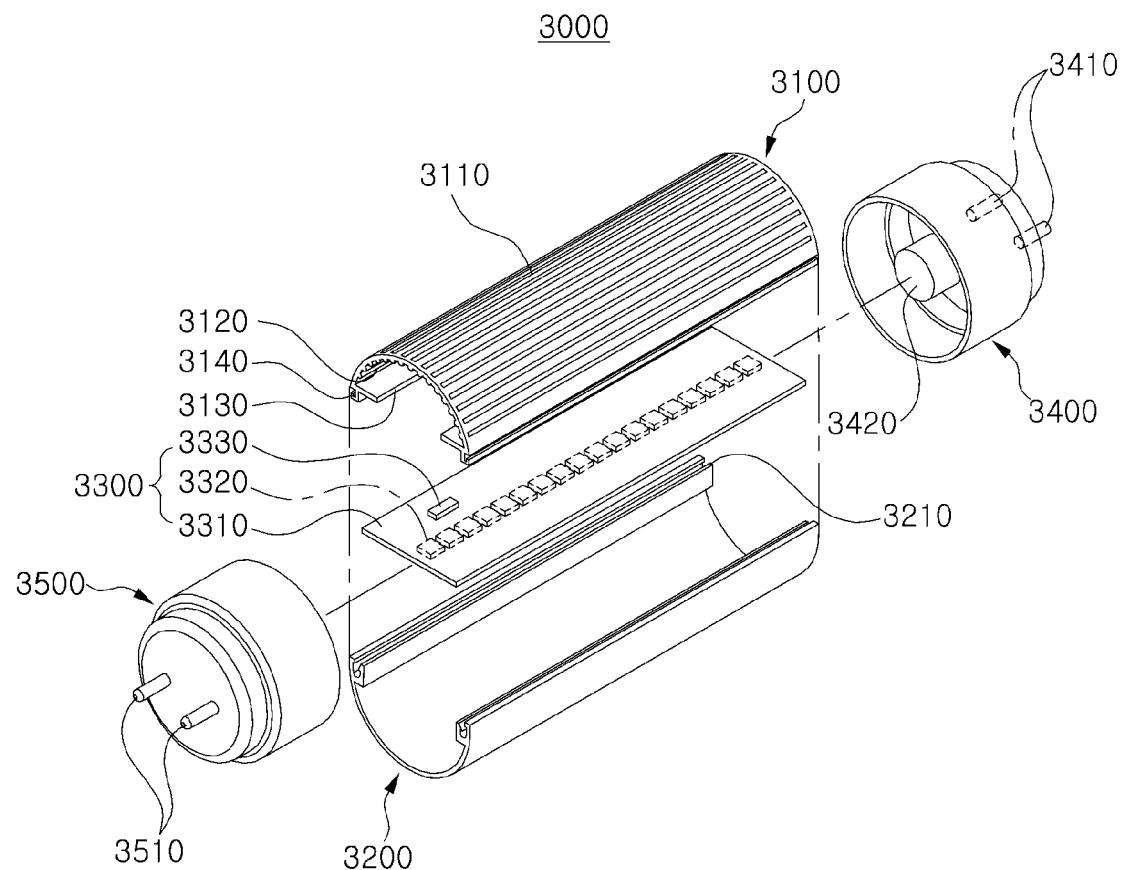
FIG. 23 is an exploded perspective view schematically illustrating a bar type lamp as a lighting device according to an example embodiment.

FIG. 23 is an exploded perspective view schematically illustrating a bar type lamp as a lighting device according to an example embodiment.

Referring to FIG. 23, a lighting device 3000 includes a heat dissipation member 3100, a cover 3200, a light source module 3300, a first socket 3400, and a second socket 3500.

A plurality of heat dissipation fins 3110 and 3120 may be formed in a concavo-convex pattern on an internal or/and external surface of the heat dissipation member 3100, and the heat dissipation fins 3110 and 3120 may be designed to have various shapes and intervals (spaces) therebetween. A support 3130 having a protrusion shape is formed on an inner side of the heat dissipation member 3100. The light source module 3300 may be fixed to the support 3130. Stoppage protrusions 3140 may be formed on both ends of the heat dissipation member 3100.

The stoppage recesses 3210 may be formed in the cover 3210, and the stoppage protrusions 3140 of the heat dissipation member 3100 may be coupled to the stoppage recesses 3210 in a hook coupling manner. The positions of the stoppage recesses 3210 and the stoppage protrusions 3140 may be interchanged.

The light source module 3300 may include a light emitting device array. The light source module 3300 may include a PCB 3310, a light source 3320, and a controller 3330. The light source 3320 may include the substrate manufactured according to the method of manufacturing a semiconductor substrate according to an example embodiment described above with reference to FIGS. 1 through 13B, or may be a device manufactured using the same. The controller 3330 may store driving information of the light source 3320. Circuit wirings are formed on the PCB 3310 to operate the light source 3320. Also, components for operating the light source 3320 may be provided on the PCB 3310.

The first and second sockets 3400 and 3500, a pair of sockets, are coupled to both ends of the cylindrical cover unit including the heat dissipation member 3100 and the cover 3200. For example, the first socket 3400 may include electrode terminals 3410 and a power source device 3420, and dummy terminals 3510 may be disposed on the second socket 3500. Also, an optical sensor and/or a communications module may be installed in either the first socket 3400 or the second socket 3500. For example, the optical sensor and/or the communications module may be installed in the second socket 3500 in which the dummy terminals 3510 are disposed. In another example, the optical sensor and/or the communications module may be installed in the first socket 3400 in which the electrode terminals 3410 are disposed.

Figure 24:
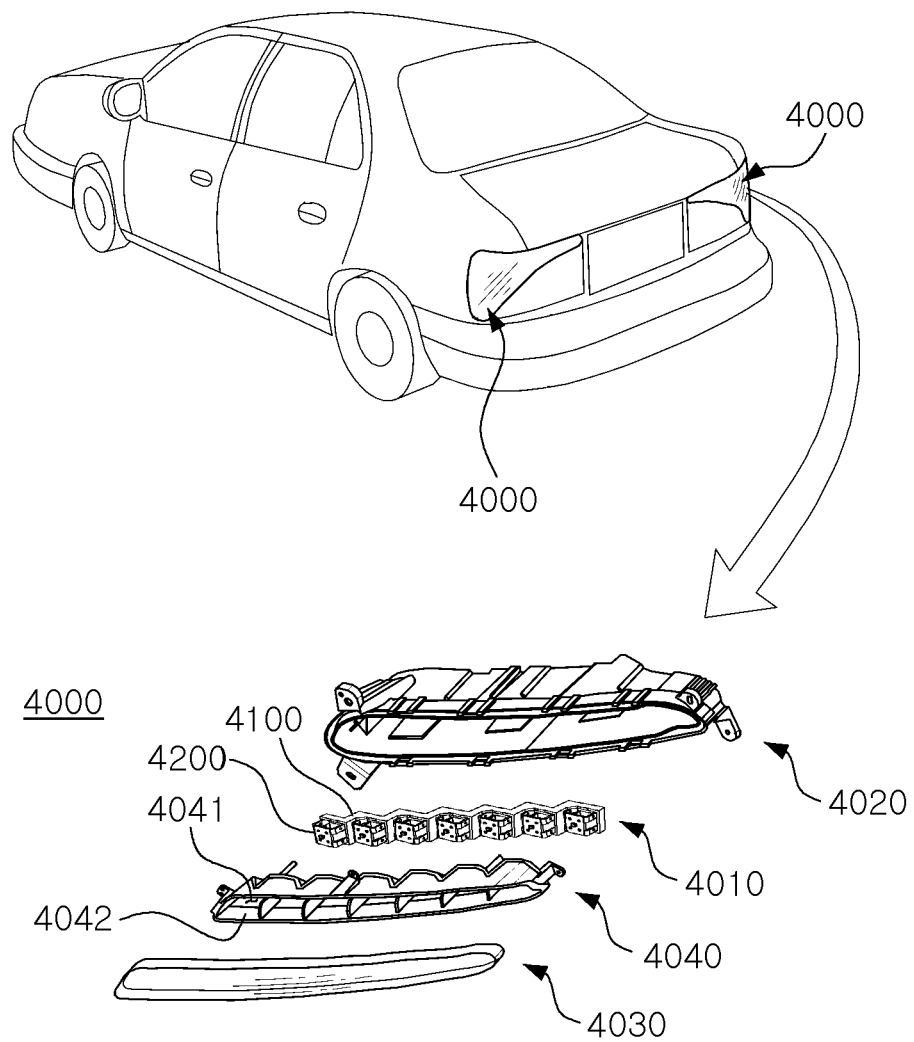
FIG. 24 is a view schematically illustrating a lighting device employing a light source module according to an example embodiment.

FIG. 24 is a view schematically illustrating a lighting device employing a light source module according to an example embodiment.

The lighting device according to the present example embodiment may include, for example, a taillight of an automobile.

Referring to FIG. 24, a lighting device 4000 may include a housing 4020 in which a light source module 4010 is supported and a cover 4030 covering the housing 4020 to protect the light source module 4010, and a reflector 4040 may be disposed on the light source module 4010. The reflector 4040 may include a plurality of reflective surfaces 4041 and a plurality of through holes 4042 provided on a bottom surface of each of the reflective surfaces 4041, and a plurality of light emitting units 4200 of the light source module 4010 may be exposed to the reflective surfaces 4041 through the through holes 4042, respectively.

The lighting device 4000 may have an overall gentle, curved structure to correspond to a shape of a corner portion of the automobile. Thus, the light emitting unit 4200 may be assembled to a frame 4100 to fit the curved surface of the lighting device 4000 to form the light source module 4010 having a step structure corresponding to the curved structure. The structure of the light source module 4010 may be variously modified according to a design of the lighting device 4000, i.e., the taillight. Also, the number of assembled light emitting units 4200 may be variously modified accordingly.

In the example embodiment, a case in which the lighting device 4000 is a taillight of an automobile is illustrated, but the exemplary embodiment is not limited thereto. For example, the lighting device 4000 may include a headlamp of an automobile and a turn signal lamp installed in a door mirror of the automobile, and in this case, the light source module 4010 may be formed to have a multi-step structure corresponding to the curved surface of the headlamp and the turn signal lamp.

Figure 25:
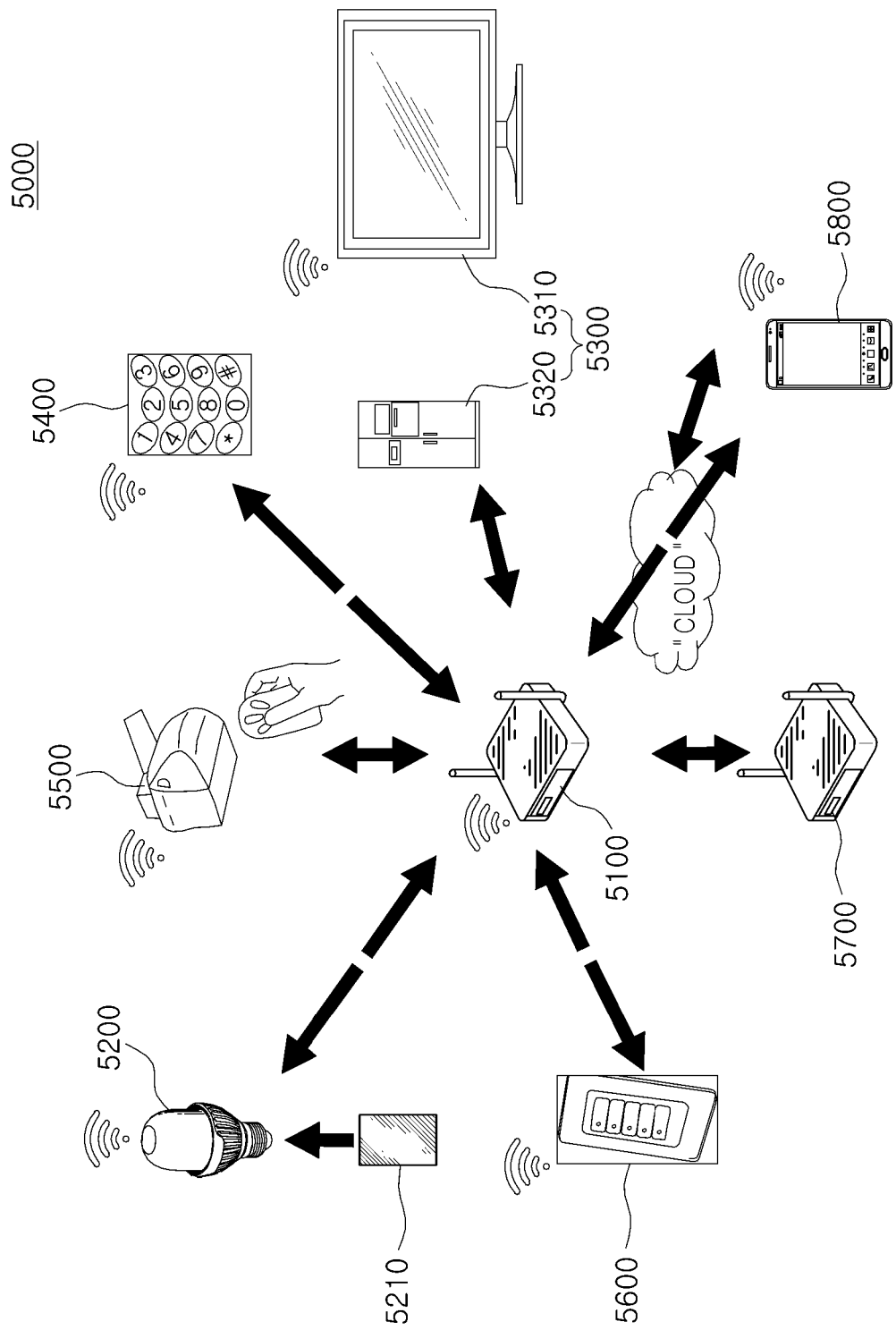
FIG. 25 is a view schematically illustrating an indoor lighting control network system according to an example embodiment.

FIG. 25 is a view schematically illustrating an indoor lighting control network system.

A network system 5000 may be a complex smart lighting-network system combining lighting technology using a light emitting device such as an LED, or the like, Internet of things (IoT) technology, wireless communications technology, and the like. The network system 5000 may be realized using various lighting devices and wired/wireless communications devices, and may be realized by a sensor, a controller, a communications unit, software for network control and maintenance, and the like.

The network system 5000 may be applied even to an open space such as a park or a street, as well as to a closed space defined within a building such as a house or an office. The network system 5000 may be realized on the basis of the IoT environment in order to collect and process a variety of types of information and provide the same to users. Here, an LED lamp 5200 included in the network system 5000 may serve to check and control operational states of other devices 5300 to 5800 included in the IoT environment on the basis of a function such as visible light communications, or the like, of the LED lamp 5200, as well as receiving information regarding a surrounding environment from a gateway 5100 and controlling lighting of the LED lamp 5200 itself.

Referring to FIG. 25, the network system 5000 may include the gateway 5100 processing data transmitted and received according to different communications protocols, the LED lamp 5200 connected to be available for communicating with the gateway 5100 and including an LED light emitting device, and a plurality of devices 5300 to 5800 connected to be available for communicating with the gateway 5100 according to various wireless communications schemes. In order to realize the network system 5000 on the basis of the IoT environment, each of the devices 5300 to 5800, as well as the LED lamp 5200, may include at least one communications module. In an example embodiment, the LED lamp 5200 may be connected to be available for communicating with the gateway 5100 according to wireless communications protocols such as Wi-Fi, ZigBee, or Li-Fi, and to this end, the LED lamp 5200 may include at least one communications module 5210 for a lamp.

As mentioned above, the network system 5000 may be applied even to an open space such as a park or a street, as well as to a closed space such as a house or an office. When the network system 5000 is applied to a house, the plurality of devices 5300 to 5800 included in the network system and connected to be available for communicating with the gateway 5100 on the basis of the IoT technology may include a home appliance 5300 such as a television 5310 or a refrigerator 5320, a digital door lock 5400, a garage door lock 5500, a light switch 5600 installed on a wall, or the like, a router 5700 for relaying a wireless communications network, and a mobile device 5800 such as a smartphone, a tablet, or a laptop computer.

In the network system 5000, the LED lamp 5200 may check operational states of various devices 5300 to 5800 using the wireless communications network (ZigBee, Wi-Fi, Li-Fi, etc.) installed in a household or may automatically control illumination of the LED lamp 5200 itself according to a surrounding environment or situation. Also, the devices 5300 to 5800 included in the network system 500 may be controlled using Li-Fi communications using visible light emitted from the LED lamp 5200.

First, the LED lamp 5200 may automatically adjust illumination of the LED lamp 5200 on the basis of information of a surrounding environment transmitted from the gateway 5100 through the communications module 5210 for a lamp or information of a surrounding environment collected from a sensor installed in the LED lamp 5200. For example, brightness of illumination of the LED lamp 5200 may be automatically adjusted according to types of programs broadcast on the television 5310 or brightness of a screen. To this end, the LED lamp 5200 may receive operation information of the TV 5310 from the communications module 5210 for a lamp connected to the gateway 5100. The communications module 5210 for a lamp may be integrally modularized with a sensor and/or a controller included in the LED lamp 5200.

For example, in a case in which a program broadcast on a TV is a drama, a color temperature of illumination may be decreased to be 12000K or lower, for example, to 5000K, and a color tone may be adjusted according to preset values, to present a cozy atmosphere. Conversely, when a program is a comedy, the network system 5000 may be configured so that a color temperature of illumination is increased to 5000K or higher according to a preset value and illumination is adjusted to white illumination based on a blue color.

Also, in a case in which no one is at home, when a predetermined time has lapsed after a digital door lock 5400 is locked, all of the turned-on LED lamps 5200 are turned off to prevent wastage of electricity. Also, in a case in which a security mode is set through the mobile device 5800, or the like, when the digital door lock 5400 is locked with no person in a home, the LED lamp 5200 may be maintained in a turned-on state.

An operation of the LED lamp 5200 may be controlled according to information regarding surrounding environments collected through various sensors connected to the network system 5000. For example, in a case in which the network system 5000 is realized in a building, lighting, a position sensor, and a communications module are combined in the building, and position information of people in the building is collected and lighting is turned on or turned off, or the collected information may be provided in real time to effectively manage facilities or effectively utilized idle space. In general, a lighting device such as the LED lamp 5200 is disposed in almost every space of each floor of a building, and thus, various types of information of the building may be collected through a sensor integrally provided with the LED lamp 5200 and used for managing facilities and utilizing idle space.

The LED lamp 5200 may be combined with an image sensor, a storage device, and the communications module 5210 for a lamp, to be utilized as a device for maintaining building security or to sense and cope with an emergency situation. For example, in a case in which a smoke or temperature sensor, or the like, is attached to the LED lamp 5200, a fire may be promptly sensed and damage may be minimized. Also, brightness of lighting may be adjusted in consideration of outside weather or an amount of sunshine, thereby saving energy and providing an agreeable illumination environment.

Figure 26:
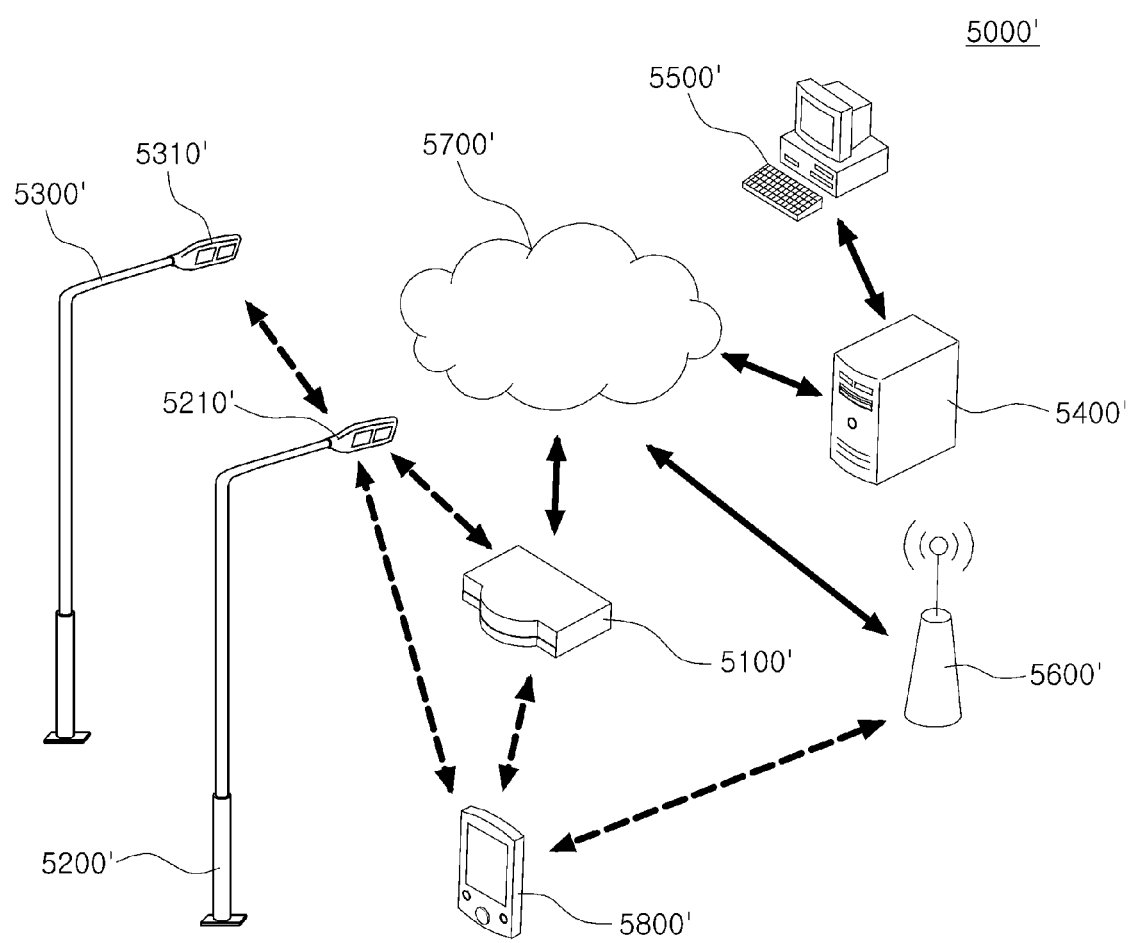
FIG. 26 is a view illustrating an example embodiment of a network system applied to an open space.

FIG. 26 is a view illustrating an example embodiment of a network system applied to an open space.

Referring to FIG. 26, a network system 5000' according to the present example embodiment may include a communications connection device 5100', a plurality of lighting fixtures 5200' and 5300' installed at predetermined intervals and connected to be available for communicating with the communications connection device 5100', a server 5400', a computer 5500' managing the server 5400', a communications base station 5600', a communications network 5700', a mobile device 5800', and the like.

Each of the plurality of lighting fixtures 5200' and 5300' installed in an open outer space such as a street or a park may include smart engines 5210' and 5310', respectively. The smart engines 5210' and 5310' may include a light emitting device emitting light, a driver driving the light emitting device, a sensor collecting information of a surrounding environment, a communications module, and the like. The smart engines 5210' and 5310' may communicate with other neighboring equipment by means of the communications module according to communications protocols such as Wi-Fi, ZigBee, and Li-Fi.

For example, one smart engine 5210' may be connected to communicate with another smart engine 5310'. Here, a Wi-Fi extending technique (Wi-Fi mesh) may be applied to communications between the smart engines 5210' and 5310'. The at least one smart engine 5210' may be connected to the communications connection device 5100' connected to the communications network 5700' by wired/wireless communications. In order to increase communications efficiency, some smart engines 5210' and 5310' may be grouped and connected to the single communications connection device 5100'.

The communications connection device 5100' may be an access point (AP) available for wired/wireless communications, which may relay communications between the communications network 5700' and other equipment. The communications connection device 5100' may be connected to the communications network 5700' in either a wired manner or a wireless manner, and for example, the communications connection device 5100' may be mechanically received in any one of the lighting fixtures 5200' and 5300'.

The communications connection device 5100' may be connected to the mobile device 5800' through a communications protocol such as Wi-Fi, or the like. A user of the mobile device 5800' may receive surrounding environment information collected by the plurality of smart engines 5210' and 5310' through the communications connection device 5100' connected to the smart engine 5210' of the lighting fixture 5200' adjacent to the mobile device 5800'. The surrounding environment information may include nearby traffic information, weather information, and the like. The mobile device 5800' may be connected to the communications network 5700' according to a wireless cellular communications scheme such as 3G or 4G through the communications base station 5600'.

The server 5400' connected to the communications network 5700' may receive information collected by the smart engines 5210' and 5310' respectively installed in the lighting fixtures 5200' and 5300' and may monitor an operational state, or the like, of each of the lighting fixtures 5200' and 5300'. In order to manage the lighting fixtures 5200' and 5300' on the basis of the monitoring results of the operational states of the lighting fixtures 5200' and 5300', the server 5400' may be connected to the computer 5500' providing a management system. The computer 5500' may execute software, or the like, capable of monitoring and managing operational states of the lighting fixtures 5200' and 5300', specifically, the smart engines 5210' and 5310'.

Figure 27:
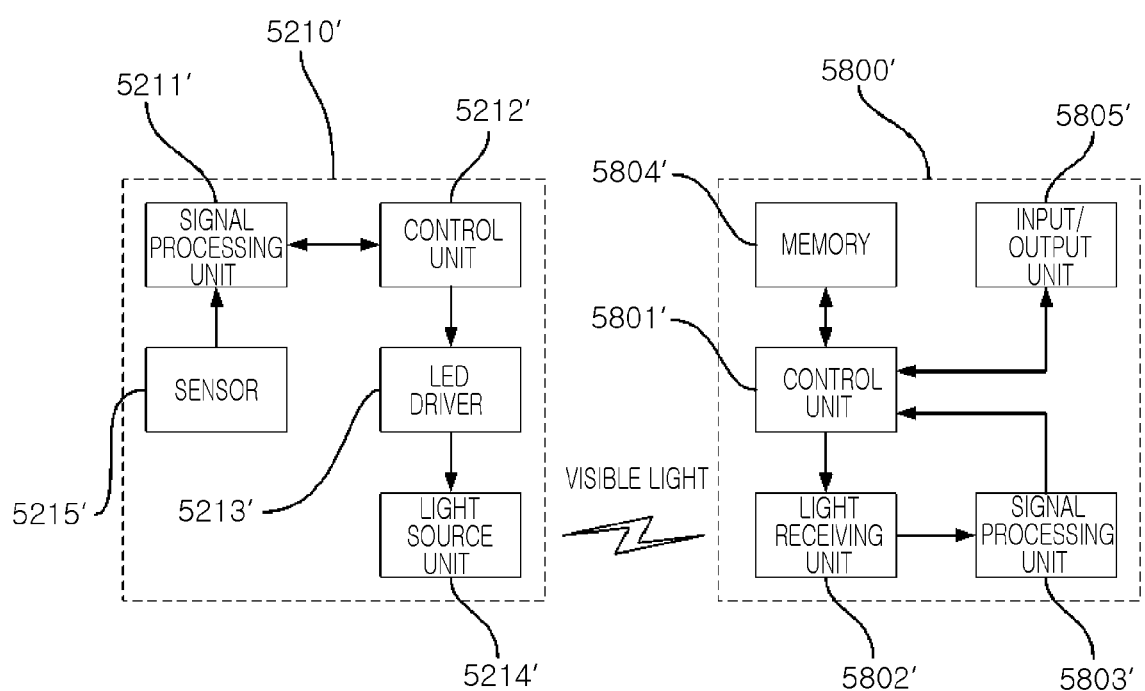
FIG. 27 is a block diagram illustrating a communications operation between a smart engine of a lighting fixture and a mobile device according to visible light communications (VLC) (or light fidelity (Li-Fi)).

FIG. 27 is a block diagram illustrating a communications operation between the smart engine of the lighting fixture and the mobile device according to visible light communications.

Referring to FIG. 27, the smart engine 5210' may include a signal processing unit 5211', a control unit 5212', an LED driver 5213', a light source unit 5214', a sensor 5215', and the like. The mobile device 5800' connected to the smart engine 5210' by visible light communications may include a control unit 5801', a light receiving unit 5802', a signal processing unit 5803', a memory 5804', an input/output unit 5805', and the like.

The visible light communications (VLC) technology (or light fidelity (Li-Fi)) is a wireless communications technology transferring information wirelessly by using light having a visible light wavelength band recognizable by the naked eye. The visible light communications technology is distinguished from existing wired optical communications technology and infrared data association (IrDA) in that it uses light having a visible light wavelength band, namely, a particular visible light frequency from the light emitting device package according to the example embodiment described above and is distinguished from the existing wired optical communications technology in that a communications environment is based on a wireless scheme. Also, unlike RF wireless communications, the VLC technology (or Li-Fi) has excellent convenience and physical security properties as it can be freely used without being regulated or needing permission in the aspect of frequency usage, and is differentiated in that a user can physically check a communications link, and above all, the VLC technology (or Li-Fi) has features of convergence technology that obtains both a unique purpose as a light source and a communications function.

The signal processing unit 5211' of the smart engine 5210' may process data intended to be transmitted and received by VLC. In an example embodiment, the signal processing unit 5211' may process information collected by the sensor 5215' into data and transmit the processed data to the control unit 5212'. The control unit 5212' may control operations of the signal processing unit 5211', the LED driver 5213', and the like, and in particular, the control unit 5212' may control an operation of the LED driver 5213' on the basis of data transmitted from the signal processing unit 5211'. The LED driver 5213' emits the light source unit 5214' according to a control signal transmitted from the control unit 5212', thereby transmitting data to the mobile device 5800'.

The mobile device 5800' may include the light receiving unit 5802' for recognizing visible light including data, in addition to the control unit 5801', the memory 5804' storing data, the input/output unit 5805' including a display, a touch screen, an audio output unit, and the like, and the signal processing unit 5803'. The light receiving unit 5802' may sense visible light and convert the sensed visible light into an electrical signal, and the signal processing unit 5803' may decode data included in the electrical signal converted by the light receiving unit 5802'. The control unit 5801' may store the data decoded by the signal processing unit 5803' in the memory 5804' or may output the decoded data through the input/output unit 5805' to allow the user to recognize the data.

As set forth above, according to example embodiments of the present inventive concept, the method of manufacturing a semiconductor substrate and the substrate for semiconductor growth, facilitating a manufacturing process by forming cavities and openings in the growth substrate and the buffer layer, respectively, may be provided.

While example embodiments have been particularly shown and described above, it will be apparent to those skilled in the art that various modifications could be made therein without departing from the scope of the inventive concept as defined by the following claims.

What is claimed is:

1. A method of manufacturing a semiconductor substrate, the method comprising:
    forming a buffer layer on a growth substrate;
    forming a plurality of openings in the buffer layer, the plurality of openings penetrating through the buffer layer and being spaced apart from one another;
    forming a plurality of cavities on the growth substrate, the plurality of cavities being aligned to respectively correspond to the plurality of openings;
    growing a semiconductor layer on the buffer layer, the growing the semiconductor layer comprising filling the plurality of openings with the semiconductor layer; and
    separating the buffer layer and the semiconductor layer from the growth substrate,
    wherein a diameter of each of the plurality of openings at a boundary between the growth substrate and the buffer layer is smaller than a diameter of each of the plurality of cavities at the boundary.

2. The method of claim 1, wherein the buffer layer protrudes in the plurality of cavities in plan view to form an undercut region within each of the plurality of cavities.

3. The method of claim 1, wherein the growing the semiconductor layer comprises covering the plurality of cavities with the semiconductor layer to form closed regions between the semiconductor layer and the growth substrate.

4. The method of claim 1, wherein the separating comprises generating a crack from the plurality of cavities in a transverse direction along the boundary between the buffer layer and the growth substrate.

5. The method of claim 1, wherein the forming the plurality of cavities comprises defining surfaces of each of the plurality of cavities in accordance with crystal planes of the growth substrate.

6. The method of claim 5, wherein each of the plurality of cavities comprises at least seven surfaces.

7. The method of claim 1, wherein at least one surface of each of the plurality of cavities comprises a negative slope such that a cross-sectional area of the growth substrate decreases in a direction away from the buffer layer.

8. The method of claim 1, wherein a ratio of a diameter of each of the plurality of openings to a distance between adjacent openings of the plurality of openings ranges from 0.65 to 18.

9. The method of claim 1, further comprising forming a growth suppressing layer on a surface of the growth substrate exposed through the plurality of cavities.

10. The method of claim 9, wherein the forming the growth suppressing layer comprises treating the growth substrate with ammonia.

11. A method of manufacturing a semiconductor substrate, the method comprising:
    providing a buffer layer on a growth substrate;
    forming at least one opening and at least one cavity in the buffer layer and in the growth substrate, respectively;
    growing a semiconductor layer from the buffer layer including the opening; and
    separating the buffer layer and the semiconductor layer from the growth substrate using a difference in coefficients of thermal expansion between the growth substrate and the buffer layer at the at least one cavity.

12. The method of claim 11, wherein the forming the at least one opening and the at least one cavity comprises forming an undercut region within the at least one cavity, the undercut region being generated due to a difference between a width of the at least one opening and a width of the at least one cavity.

13. The method of claim 12, wherein the buffer layer overhangs over the at least one cavity of the growth substrate to form the undercut region within the at least one cavity.

14. The method of claim 11, wherein a maximum length of the at least one opening measured along a junction surface between the growth substrate and the buffer layer is smaller than a maximum length of the at least one cavity measured along the junction surface, the junction surface corresponding to a surface where the growth substrate and the buffer layer are joined.

15. The method of claim 14, wherein an area of the opening on the junction surface ranges from 20% to 90% of an area of the buffer layer on the junction surface.

16. The method of claim 11, wherein the at least one opening and the at least one cavity are concentric.

17. The method of claim 11, wherein the at least one cavity comprises a plurality of cavities, and
    wherein the forming the at least one cavity comprises forming the plurality of cavities only in one of an inner portion or an outer portion of the growth substrate.

18. A method of manufacturing a semiconductor substrate, the method comprising:
    providing a buffer layer on a growth substrate;
    forming at least one opening and at least one cavity in the buffer layer and in the growth substrate, respectively, the at least one opening and the at least one cavity being concentric to each other;
    growing a semiconductor layer from the buffer layer including the at least one opening; and
    separating the buffer layer and the semiconductor layer from the growth substrate,
    wherein the buffer layer overhangs over the at least one cavity of the growth substrate to form an undercut region within the at least one cavity.

19. The method of claim 18, wherein the separating comprises separating using a difference in coefficients of thermal expansion between the growth substrate and the buffer layer at the at least one cavity.

20. The method of claim 18, wherein the at least one cavity comprises a plurality of cavities, and
    wherein the forming the at least one cavity comprises forming the plurality of cavities only in one of an inner portion or an outer portion of the growth substrate.

* * * * *